(12) United States Patent
Matsubara et al.

(10) Patent No.: US 9,116,303 B2
(45) Date of Patent: Aug. 25, 2015

(54) HOLOGRAM WITH CELLS TO CONTROL PHASE IN TWO POLARIZATION DIRECTIONS AND EXPOSURE APPARATUS

(75) Inventors: Isao Matsubara, Tucson, AZ (US); Yasuyuki Unno, Tucson, AZ (US); William Dallas, Tucson, AZ (US); Tom D Milster, Tucson, AZ (US)

(73) Assignees: CANON KABUSHIKI KAISHA, Tokyo (JP); ARIZONA BOARD OF REGENTS ON BEHALF OF THE UNIVERSITY OF ARIZONA, Tuscon, AZ (US)

( * ) Notice: Subject to any disclaimer, the term of this patent is extended or adjusted under 35 U.S.C. 154(b) by 848 days.

(21) Appl. No.: 12/718,666

(22) Filed: Mar. 5, 2010

(65) Prior Publication Data

US 2011/0216296 A1 Sep. 8, 2011

(51) Int. Cl.
*G02B 5/32* (2006.01)
*G03B 27/54* (2006.01)

(52) U.S. Cl.
CPC . *G02B 5/32* (2013.01); *G03B 27/54* (2013.01)

(58) Field of Classification Search
CPC .............................. G02B 5/32; G03F 7/70191
USPC .................................. 355/71, 67, 53; 359/15
See application file for complete search history.

(56) References Cited

U.S. PATENT DOCUMENTS

| | | | |
|---|---|---|---|
| 6,304,318 B1 * | 10/2001 | Matsumoto | ...................... 355/55 |
| 7,009,686 B2 | 3/2006 | Kawashima | |
| 7,126,673 B2 | 10/2006 | Mori | |
| 7,265,816 B2 | 9/2007 | Tsuji | |
| 2006/0028957 A1 | 2/2006 | Kim | |
| 2009/0034036 A1 * | 2/2009 | Matsubara | ........................ 359/9 |

FOREIGN PATENT DOCUMENTS

| | | |
|---|---|---|
| JP | 6-053120 | 2/1994 |
| JP | 2006-196715 | 7/2006 |
| WO | WO2009/084409 | 7/2009 |
| WO | WO2009/084466 | 7/2009 |

OTHER PUBLICATIONS

J.R. Fienup, "Iterative method applied to image reconstruction and to computer generated holograms," Optical Engineering, May/Jun. 1980, 297-305, vol. 19, No. 3.

Jens Hoβfeld et al., "Polarizing computer generated holograms," Optical Engineering, Aug. 1993, 1835-1837, vol. 32, No. 8.

(Continued)

*Primary Examiner* — Chia-How Michael Liu
(74) *Attorney, Agent, or Firm* — Canon USA, Inc., IP Division

(57) ABSTRACT

The present invention provides a hologram which forms a light intensity distribution on a predetermined plane by using incident light. The hologram includes a plurality of cells configured to control both a phase of a first polarized light component in a first polarization direction of the incident light and a phase of a second polarized light component in a second polarization direction perpendicular to the first polarization direction, to form a phase difference distribution between phase distributions for the first and second polarized light components. The plurality of cells are designed so that a number of phase difference levels of the phase difference distribution is less than a number of phase levels of the phase distribution of the first polarized light component.

15 Claims, 18 Drawing Sheets

(56) References Cited

OTHER PUBLICATIONS

Fang Xu et al., Polarization-selective computer-generated holograms: design, fabrication, and applications, Applied Optics, Jan. 10, 1995, 256-266, vol. 34, No. 2.

Wanji Yu et al., "Polarization multiplexed diffractive optical elements fabricated by subwavelength structures," Applied Optics, Jan. 1, 2002, 96-100, vol. 41, No. 1.

S.H. Tao et al., "Optimized polarization-selective computer-generated hologram with fewer phase combinations," Optics Express, Jun. 2, 2003, 1252-1256, vol. 11, No. 11.

* cited by examiner

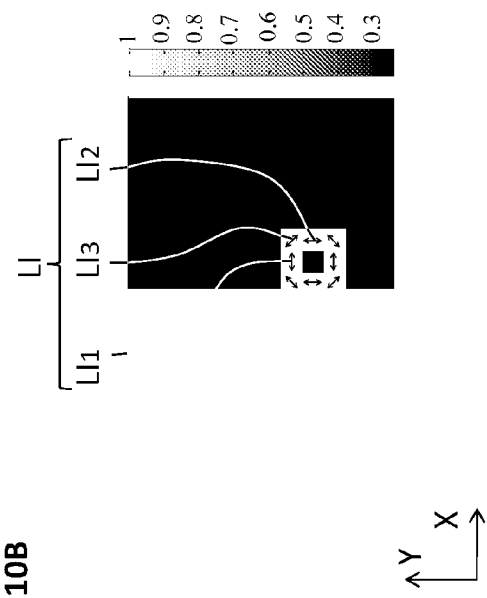
FIG. 10A
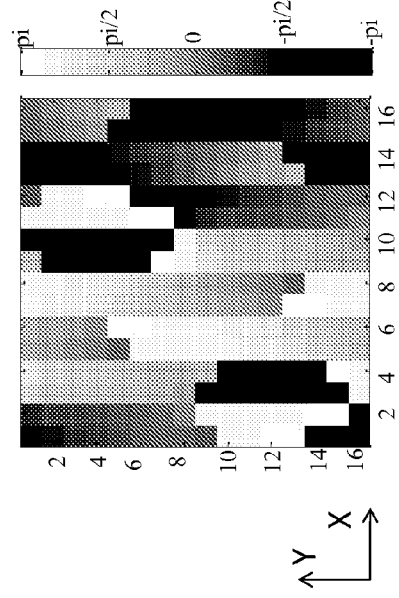
FIG. 10B
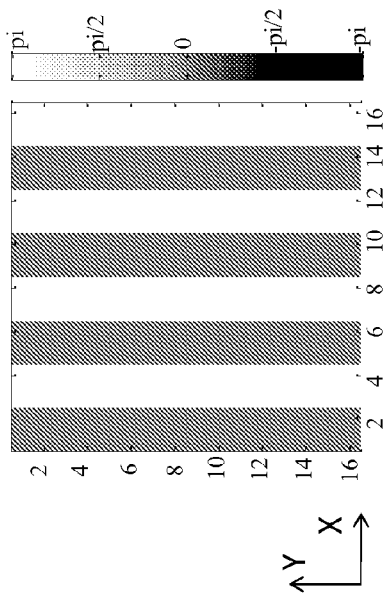
FIG. 10C
FIG. 10D

HOLOGRAM WITH CELLS TO CONTROL PHASE IN TWO POLARIZATION DIRECTIONS AND EXPOSURE APPARATUS

BACKGROUND OF THE INVENTION

1. Field of the Invention

The present invention relates to a hologram and an exposure apparatus.

2. Description of the Related Art

A projection exposure apparatus has conventionally been employed to fabricate a micro-patterned semiconductor device such as a semiconductor memory or a logic circuit by using photolithography (printing). The projection exposure apparatus projects and transfers a circuit pattern formed on a reticle (mask) onto a substrate such as a wafer via a projection optical system.

The resolution R of the projection exposure apparatus is given by:

$$R = k_1 \times \frac{\lambda}{NA} \quad (1)$$

where λ is the exposure light wavelength, NA is the numerical aperture of the projection optical system, and $k_1$ is a process constant determined by, for example, a development process.

The shorter the exposure-light wavelength or the higher the NA of the projection optical system, the higher the resolution. However, it might be difficult to further shorten the current exposure light wavelength because the transmittance of a glass material generally decreases as the exposure-light wavelength shortens. It might also be difficult to further increase the NA of the projection optical system available at present because the depth of focus decreases in inverse proportion to the square of the NA of the projection optical system, and because it might be difficult to design and manufacture lenses to form a high-NA projection optical system.

The application of resolution enhanced technologies (RETS) have been proposed for improving the resolution by decreasing the process constant $k_1$. One of these RETS is the so-called modified illumination method (oblique or off-axis illumination method).

The modified illumination method generally inserts an aperture stop, which has a light-shielding plate on the optical axis of an optical system, in the vicinity of the exit surface of an optical integrator that forms a uniform plane illumination, thereby obliquely irradiating a reticle with exposure light.

The modified illumination method includes, for example, an annular illumination method and a quadrupole illumination method that are different in the aperture shape of an aperture stop (i.e., the shape of the light intensity distribution). There has also been proposed another modified illumination method which uses a computer generated hologram (CGH) in place of an aperture stop in order to improve the use efficiency (illumination efficiency) of the exposure light.

Along with an increase in the NA of the projection optical system, a polarized illumination method which controls the polarization state of exposure light is also required to increase the resolution of the projection exposure apparatus. The polarized illumination method illuminates a reticle with, for example, S-polarized light alone, which has an electric field component in the circumferential direction about the optical axis. The contrast of the image to be formed might be enhanced by using S-polarized light alone.

In recent years, there has been proposed a technique which exploits both the modified illumination method (the formation of a light intensity distribution having a desired shape, e.g., a quadrupolar shape) and the polarized illumination method (i.e., polarization state control).

For example, Japanese Patent Laid-Open No. 2006-196715 discloses a technique which implements both the modified illumination method and polarized illumination method using a light beam conversion element composed of a variety of combinations between a form birefringence region and a diffraction region. Japanese Patent Laid-Open No. 2006-196715 describes controlling the polarization state using a form birefringence region and the shape (i.e., a reconstructed image) of the light intensity distribution at a predetermined plane using the diffraction region. The number of combinations depends on the kinds of polarization states formed on the predetermined plane.

U.S. Pat. No. 7,265,816 (or Japanese Patent Laid-Open No. 2006-5319) discloses a technique which can control the balance among the four poles of a quadrupolar light intensity distribution typically formed by the modified illumination method and the polarized illumination method. U.S. Pat. No. 7,265,816 refers, after converting four circularly polarized lights into four linearly polarized lights different from each other with a quarter wave plate (QWP), to changing the light intensity distribution at a predetermined plane by controlling the balance with using four separated CGHs which function as a diffractive optical element corresponding to each linearly polarized light.

A CGH design technique is disclosed in "Iterative method applied to image reconstruction and to computer-generated holograms", OPTICAL ENGINEERING, Vol. 19, No. 3, May/June 1980, 297-305. The conventional technique uses a plurality of the separated CGHs to form a reconstructed image composed of a plurality of polarization states, and the number of separated CGHs depends on the number of a variety of polarization states.

When the plurality of the separated CGHs combined with each other is used, an irradiance variation might occur in a reconstructed image. If an optical integrator cannot sufficiently correct the intensity distribution of the incident light, the light may impinge on only some of the plurality of CGHs.

SUMMARY OF THE INVENTION

According to an aspect of the present invention, a hologram which forms a light intensity distribution on a predetermined plane by using incident light is provided. The hologram includes a plurality of cells configured to control both a phase of a first polarized light component in a first polarization direction of the incident light and a phase of a second polarized light component in a second polarization direction perpendicular to the first polarization direction, to form a phase difference distribution between phase distributions for the first and second polarized light components. The plurality of cells are designed so that a number of phase difference levels of the phase difference distribution is less than a number of phase levels of the phase distribution of the first polarized light component.

According to another aspect of the present invention, an apparatus which includes a light source, and an illumination optical system including a hologram such as the one described above is provided.

According to another aspect of the present invention, an exposure apparatus including an illumination optical system and a projection optical system is provided. The illumination optical system is configured to illuminate a reticle with a light source. The illumination optical system includes a hologram such as the one described above. The projection optical system is configured to project a pattern of the reticle onto a substrate.

Further features of the present invention will become apparent from the following description of exemplary embodiments with reference to the attached drawings.

BRIEF DESCRIPTION OF THE DRAWINGS

FIG. 10A illustrates a condition of phase difference.

FIG. 10B illustrates an exemplary target image.

FIGS. 10C and 10D illustrate phase distributions of computer generated holograms for X and Y-polarizations, respectively.

DESCRIPTION OF THE EMBODIMENTS

Figure 1B:
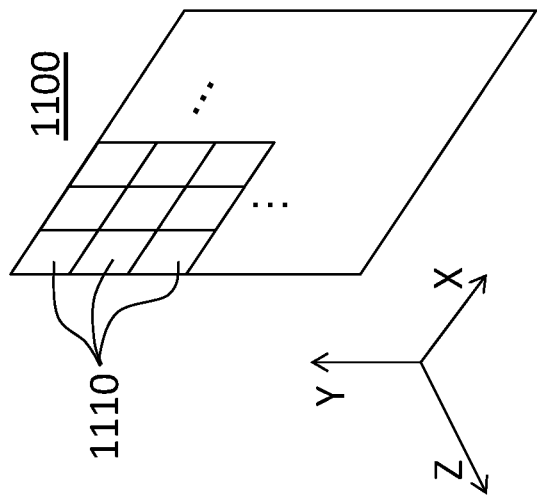
FIG. 1B illustrates a plurality of cells of the hologram.

Exemplary embodiments according to the present invention will be described below with reference to the attached drawings. The same reference numerals denote the same members throughout the drawings, and a repetitive description thereof will not be given.

Figure 1A:
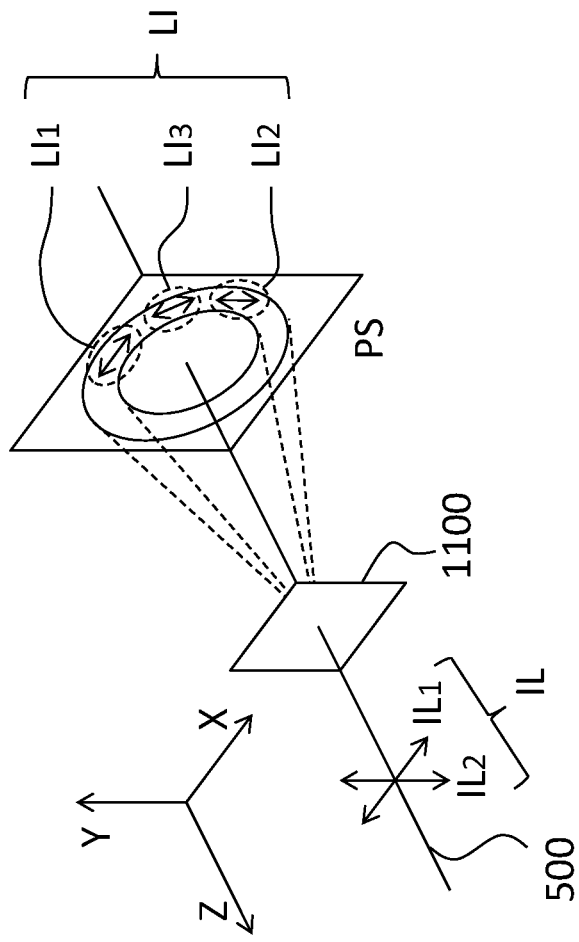
FIG. 1A illustrates a hologram and a light intensity distribution on a predetermined plane.

FIG. 1A illustrates a hologram 1100 which is used for the embodiment according to the present invention instead of the plurality of separated CGHs. A reconstructed image is generated by the hologram 1100. The hologram 1100 may be, for example, a computer generated hologram.

As shown in FIG. 1A, the hologram 1100 forms a light intensity distribution (i.e., reconstructed image) LI on a predetermined plane PS by modulating a phase distribution of a wavefront of an incident light IL. The hologram can be located at an aperture position in an illumination system of a lithography apparatus. A shape of the light intensity distribution LI is not limited to the shape illustrated in FIG. 1A. An incident direction of the incident light IL to the hologram 1100 is denoted by reference numeral 500.

The hologram 1100 can be designed to control a phase of a first polarized light component (e.g., a first linearly polarized light component $IL_1$), in a first polarization direction (e.g., X-polarization), of an incident light IL. The first linearly polarized light component $IL_1$ can form a first light intensity distribution $LI_1$ on the predetermined plane PS.

The hologram 1100 also can be designed to control a phase of a second polarized light component (e.g., a second linearly polarized light component $IL_2$), in a second polarization direction (e.g., Y-polarization) perpendicular to the first polarization direction. The second linearly polarized light component $IL_2$ can form a second light intensity distribution $LI_2$ on the predetermined plane PS.

In addition to $IL_1$ and $IL_2$, the reconstructed image LI can include a light intensity distribution $LI_3$ composed of X and Y-polarizations as necessary. The hologram 1100 can control both phases of X and Y-polarizations so that $IL_1$ and $IL_2$ form a light intensity $LI_3$ formed by synthesis of X and Y-polarizations. To obtain a predetermined polarization state in the light intensity distribution $LI_2$, amplitudes and/or phases of light at the predetermined plane PS might be controlled.

For example, when an incident light IL is a linearly polarized light in a polarization direction of +45° with respect to an X-axis, the polarization direction of the linearly polarized light can be changed in a range from more than 0° to less than +90° with respect to an X-axis by controlling the amplitude ratio (the intensity rate) of X-polarization to Y-polarization at the predetermined plane PS. And also, when the polarization direction of the linearly polarized light is changed over the range, a phase difference (e.g., π) between X and Y-polarizations may be controlled in addition to the control of the amplitude ratio.

The hologram 1100 includes a plurality of cells 1110 (e.g., a collection of cells 1110) as shown in FIG. 1B to control phases of the first and second linearly polarized light components. The plurality of cells are designed so that the reconstructed image corresponds to the target image. To obtain phase distributions different from each other, wavefronts of X and Y-polarizations may be independently controlled by the hologram 1100.

The cells 1110 can include an anisotropic medium and an isotropic medium. The anisotropic medium can control phase difference between X and Y-polarizations, and the isotropic medium can control phases of X and Y-polarizations equally. For some of the isotropic medium in the cells, the thickness in the Z direction might be zero. Processing an anisotropic medium may be more difficult than processing an isotropic medium. Therefore, from the viewpoint of fabrication, the description herein will use the condition that the number of thickness levels for anisotropic mediums is less than that of isotropic mediums. To realize this condition, the number of phase difference levels between X and Y-polarizations can be designed to be less than the number of phase levels of X and Y-polarizations. In other words, the plurality of cells 1110 can be designed so that a number of phase difference levels of the phase difference distribution is less than a number of phase levels of the phase distribution of X-polarization or Y-polarization.

In order to obtain higher diffractive efficiency (DE) with a CGH, a number of phase levels may be increased. Although CGHs are conventionally designed to have a number of phase difference levels similar to the number of the phase levels, the number of phase difference levels might not be equal to the number of the phase levels.

Figure 2A:
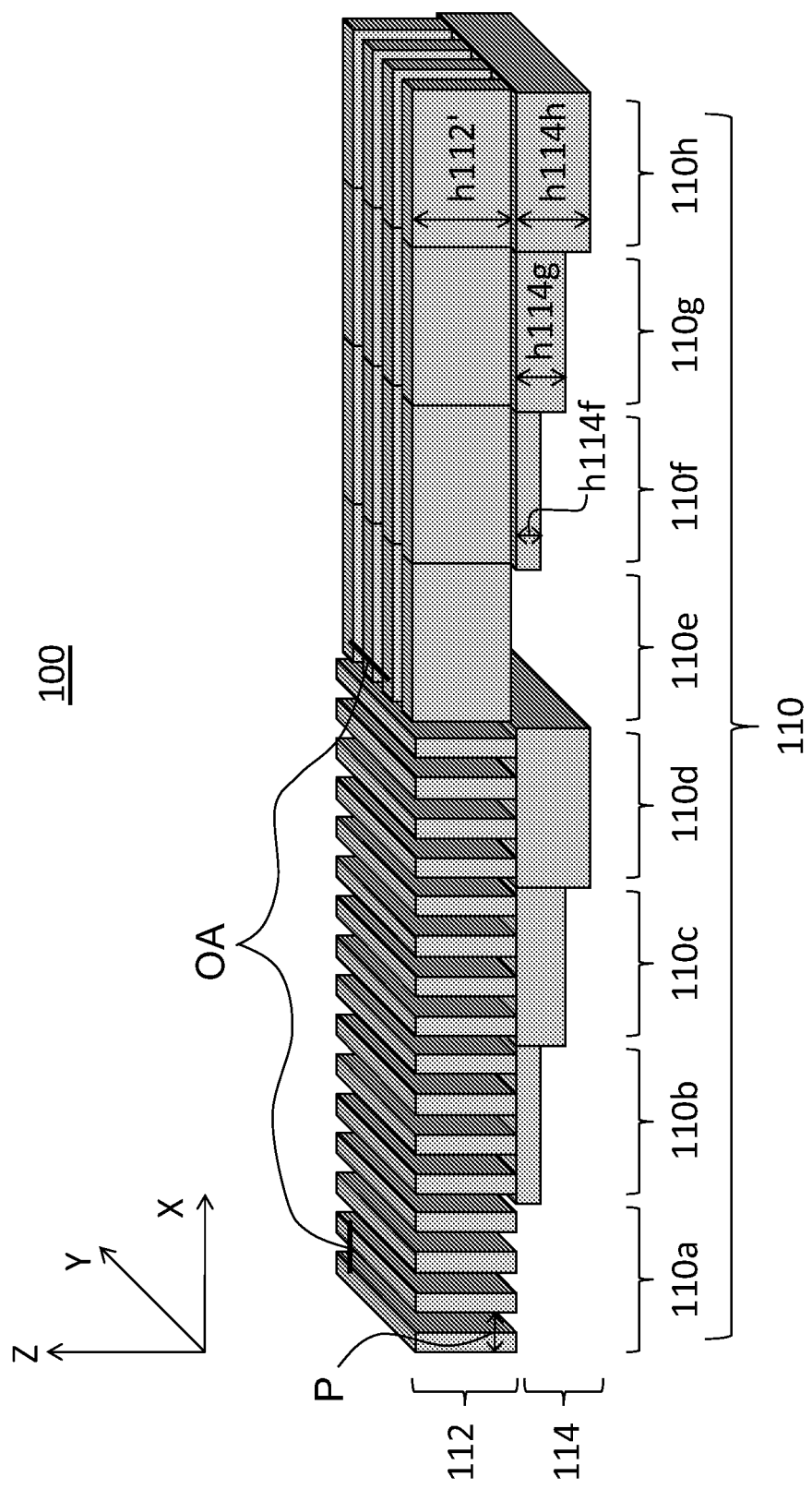
FIG. 2A is a perspective view showing a cell structure having a three-dimensional structure which generates form birefringence.

FIG. 2A illustrates a perspective view showing a cell structure 100 with an anisotropic medium 112 formed from diffraction gratings which generate form birefringence. A pitch P of the grating is smaller than the wavelength of the incident light in order to prevent the generation of diffracted light components of orders other than the 0th order. Examples of each cell 110a to 110h (collectively 110) are shown in FIG. 2A. The optic axis (OA) of the anisotropic medium indicates the direction in which no birefringence occurs, because the refractive indices in all directions perpendicular to a propagation direction of an incident light are constant. In other words, ordinary and extraordinary rays match each other or have a minimum deviation.

FIG. 2A shows an example for a combination of the number of thickness levels of anisotropic mediums 112 is one (thickness h112'), and that of thickness levels of isotropic mediums 114 is four including a zero thickness (zero thickness, thickness h114f, thickness h114g, and thickness h114h).

If phase distributions for X and Y-polarizations are designed using defined equally quantized levels under no condition regarding a phase difference, then the number of phase difference levels can be the same as the number of phase levels. As to a value of phase, it is considered that π is equivalent to −π, and also as to a value of phase difference, π is equivalent to −π.

Figure 2B:
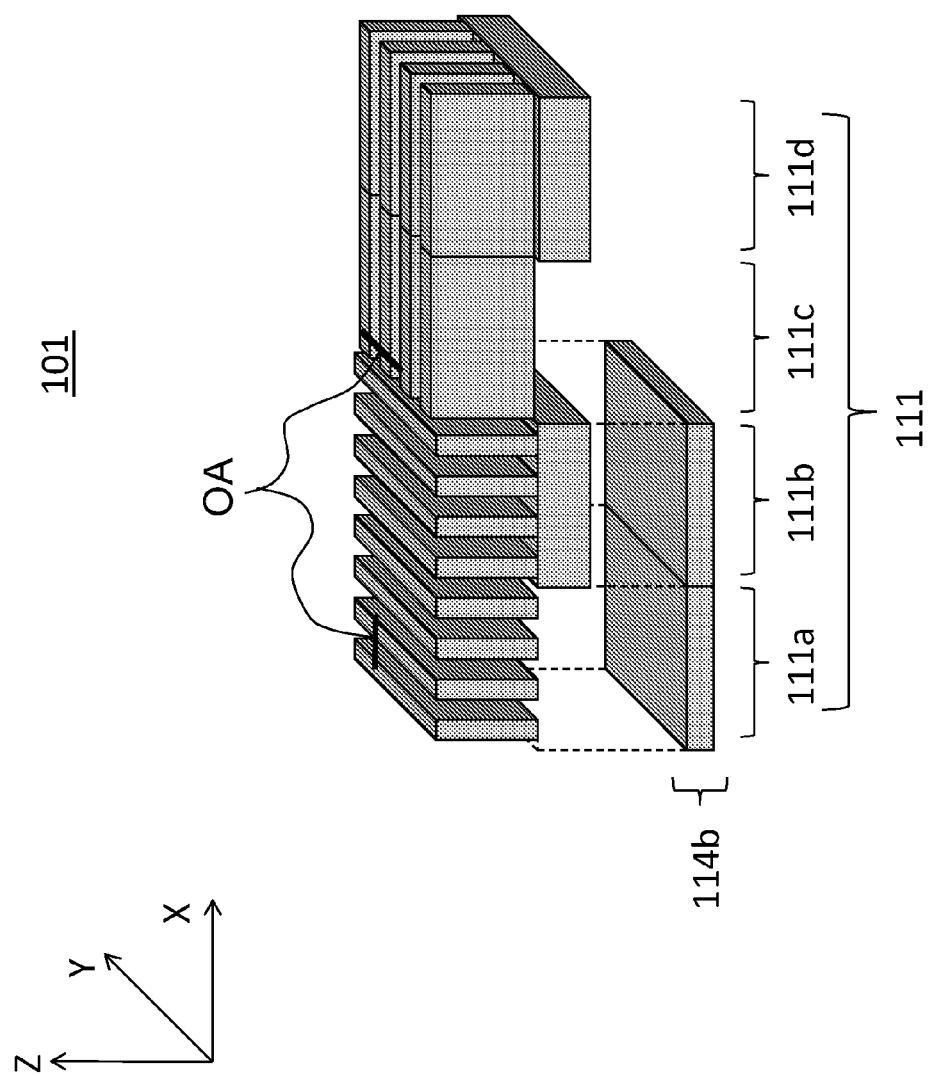
FIG. 2B illustrates a perspective view showing a cell structure whose phase level is two.

FIG. 2B illustrates a perspective view showing a cell structure 101 whose phase difference levels and phase levels are two, respectively. The cell structure 101 includes cells 111 including a cell 111a, a cell 111b, a cell 111c, and a cell 111d. According to two phase difference levels, there are two kinds of cells whose strip direction of the anisotropic medium 112 is different. According to two phase levels, there are two kinds of cell thickness of the isotropic medium 114a. If a circularly polarized light is used as an incident light, a phase shift of π/2 is used to cancel a phase difference of the incident light. Another second isotropic medium 114b can be added to a first isotropic medium 114a for this purpose (i.e. the phase shift). Then, there are actually four kinds of cell thickness of the isotropic mediums 114.

Figure 2C:
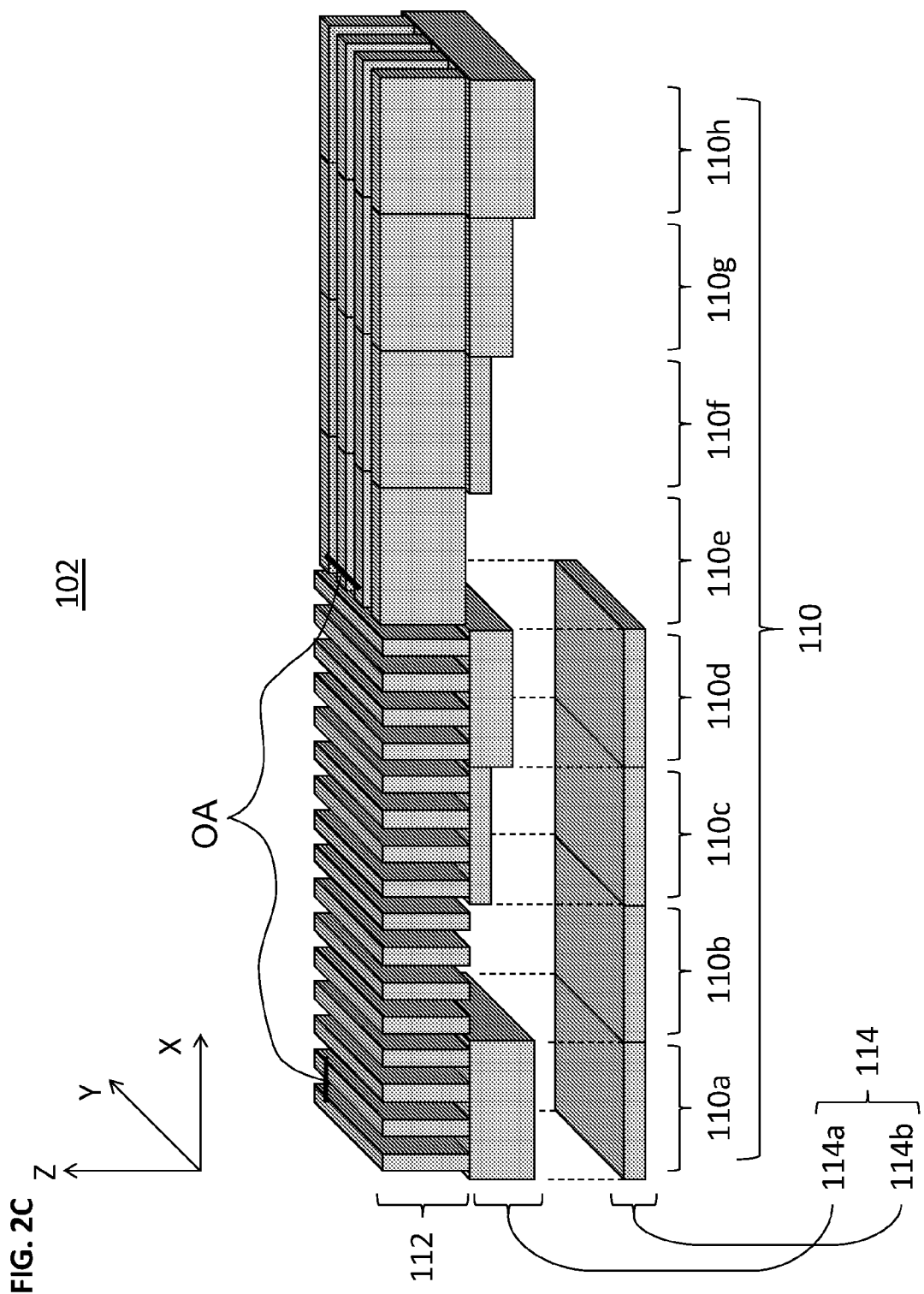
FIG. 2C is another perspective view showing a cell structure having a three-dimensional structure.

FIG. 2C illustrates another example of the cell structure 102. The first isotropic medium 114a can control phases of X and Y-polarizations equally. The second isotropic medium 114b can cancel the phase difference of the incident light having a phase difference of π/2. Although the first and second isotropic mediums (114a and 114b) are drawn separately, they can be integrated each other. And when an incident light has no phase difference between the first and second linearly polarized light components ($IL_1$ and $IL_2$), or when there is no need to make both phases of the incident light equal, the second isotropic medium 114b might be omitted.

The thickness of the first and second isotropic mediums (114a and 114b) of the cell 110a in FIG. 2C correspond to making the phase shift 2π, so it can be removed as shown in FIG. 2A. When the cell structures of the hologram in FIGS. 2A and 2C have four phase levels, and a smallest step of isotropic medium 114a of the cell 110f corresponds to π/2, the number of the isotropic medium is not changed by adding 114b as shown in FIG. 2C. In other words, the numbers of the isotropic mediums in FIGS. 2A and 2C, are the same. Therefore, the numbers of anisotropic medium and isotropic medium in FIG. 2B are the same as FIG. 2A. While preventing the fabrication process from becoming more difficult, DE can become lower by using the present invention. Especially, if the target image is asymmetric, DE made by two phase levels composed of isotropic medium 114a in FIG. 2B might be less than 50%, but DE made by two phase difference levels and four phase levels as shown in FIG. 2A can be over 50%.

Figure 3:
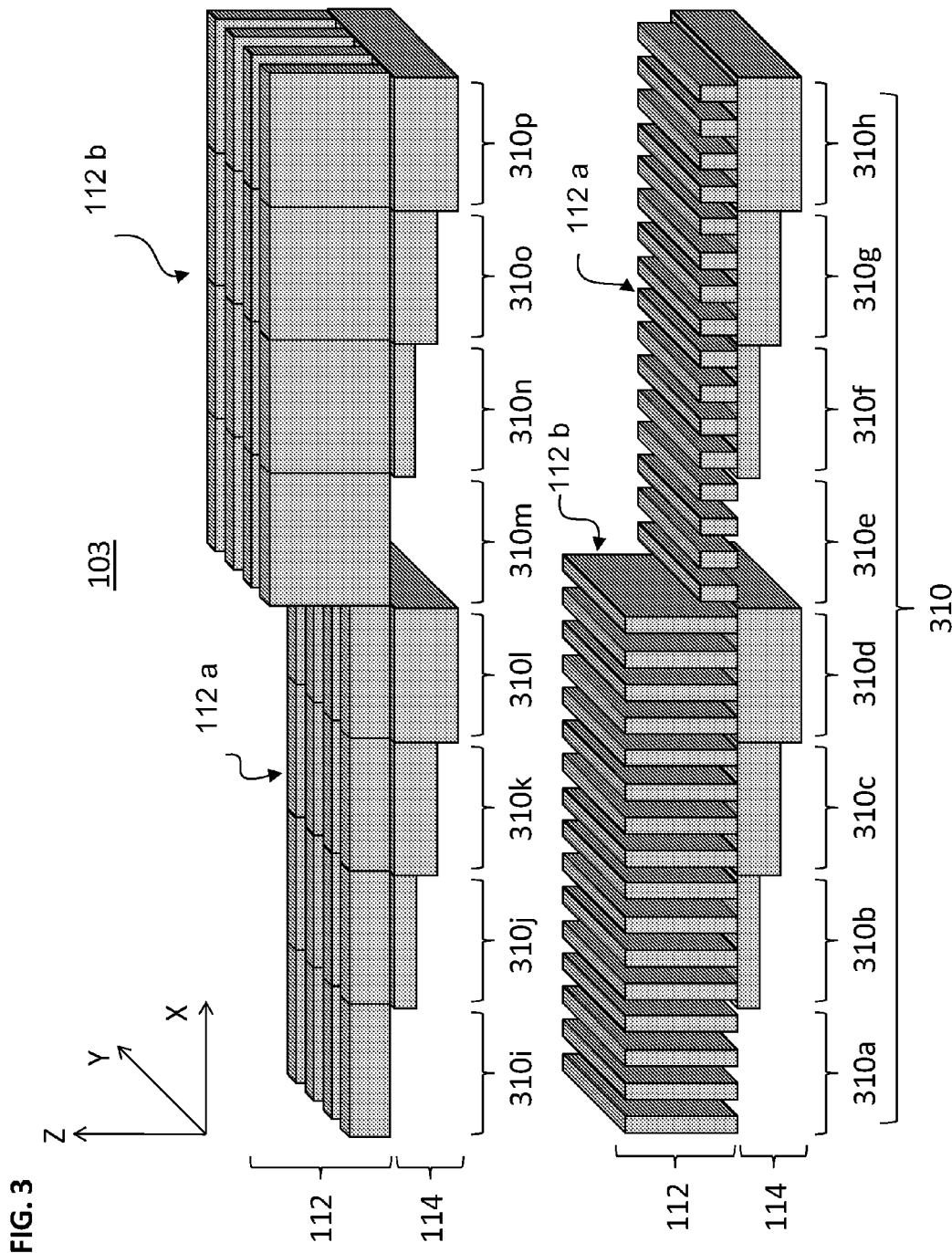
FIG. 3 illustrates a perspective view showing a cell structure whose phase level is four.

FIG. 3 illustrates a perspective view showing a cell structure in which both phase difference levels and phase levels are four. The number of anisotropic medium is two, which is bigger than that of FIG. 2A. The anisotropic medium 112 in the cell structure 103, which includes cells 310a to 310p, has two kinds of thickness 112a and 112b. This means that DE can be higher than that made by two phase levels.

When phase distributions are generated with the condition that the number of phase difference levels is less than the number of phase levels, the degree of freedom for hologram designing can be increased. The phase difference distribution can include a phase difference value of 0 and pi in alternate arrangement. And also the phase difference distribution can have an interlaced distribution or a checkered distribution. The plurality of cells can be divided into alternating columns of the first and second polarized light components (X- and Y-polarizations).

Example 1

Random Distribution of Phase Difference with SWS

A detailed example of a computer generated hologram as the hologram 1100 in FIG. 1A will be described below.

Figure 4A:
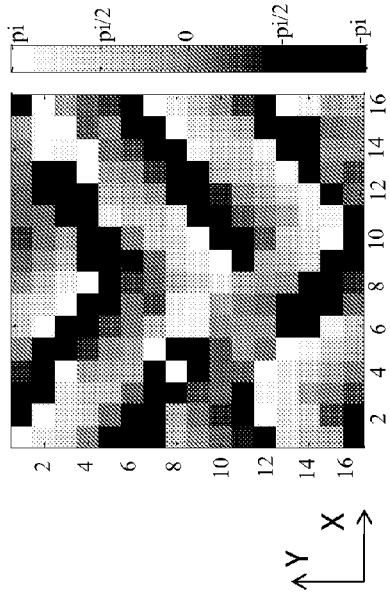
FIG. 4A illustrates an exemplary target image.

An example to design the light intensity distribution (a target image) is shown in FIG. 4A. This target image consists of S-polarization. The S-polarization means each pixel on the predetermined plane PS is formed by the linearly polarized light, and a direction of the polarized light for each pixel is along a circumferential direction of concentric circles. Each polarization state on the predetermined plane PS is indicated by an arrow in FIG. 4A.

Figure 4C:
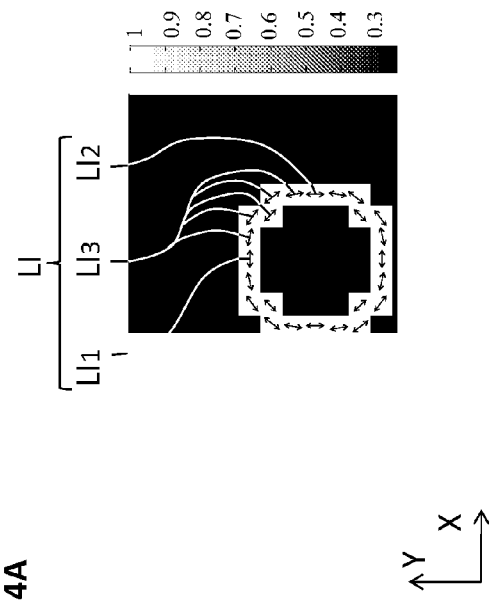
FIGS. 4B and 4C illustrate phase distributions of computer generated holograms for X and Y-polarizations, respectively.
Figure 4B:
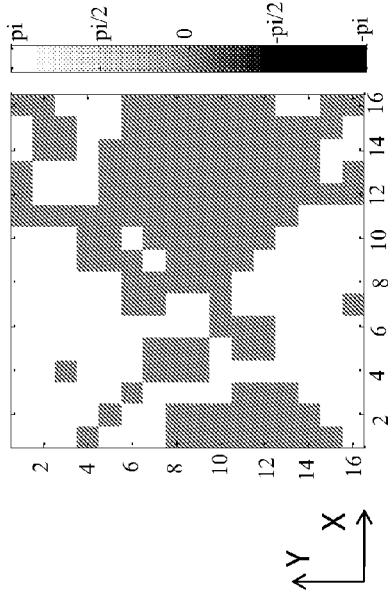
Figure 4D:
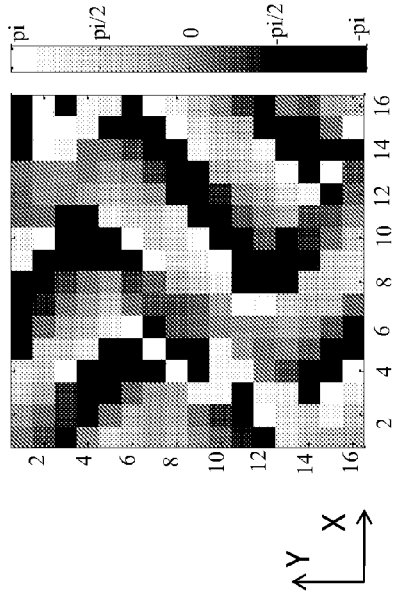
FIG. 4D illustrates a phase difference distribution of a computer generated hologram corresponding to FIGS. 4B and 4C.

FIGS. 4B and 4C illustrate phase distributions for X and Y-polarizations respectively designed as hologram data. The number of cells is 16 by 16. These phase distributions are designed under the condition that the number of phase difference levels between X and Y-polarizations is less than the number of phase levels for X and Y-polarizations. In this example, the number of phase difference levels is two as shown in FIG. 4D, and the number of phase levels is substantially infinite. The hologram data is designed so that a light which passes through the hologram 1100 has phase distributions for X and Y-polarizations as shown in FIGS. 4B and 4C respectively. The number of phase difference levels can be designed to be more than two, and the number of phase levels can be designed to be less than infinity and more than two (e.g., 4, 8 or 16) under the condition that the number of phase differences is less than the number of phases.

As mentioned above, FIG. 4D illustrates a phase difference distribution between X and Y-polarizations, which is obtained by subtracting a value of a phase of each cell in FIG. 4B from a value of a phase corresponding to the cell in FIG. 4C. The value in FIG. 4D is 0 or $\pi$, which means that the number of phase difference levels is designed to be two.

Figure 4F:
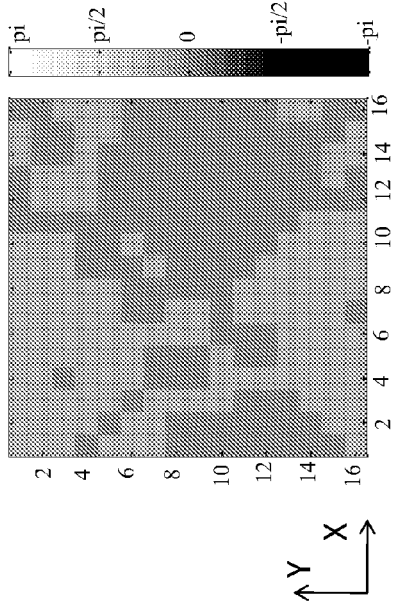
FIG. 4F illustrates a phase distribution to compensate a phase shift caused by an anisotropic medium of FIG. 2A.
Figure 4H:
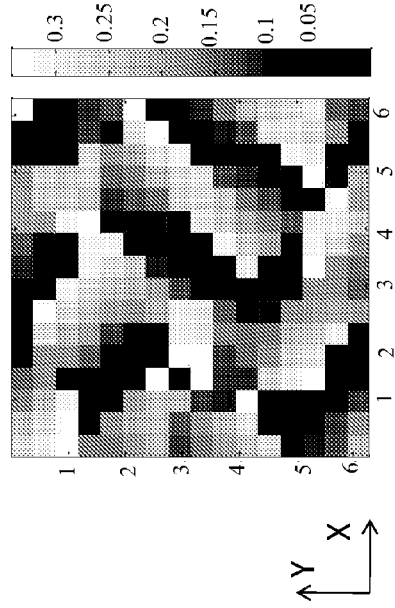
FIG. 4H illustrates a thickness distribution of an isotropic medium based on FIG. 2A.
Figure 4E:
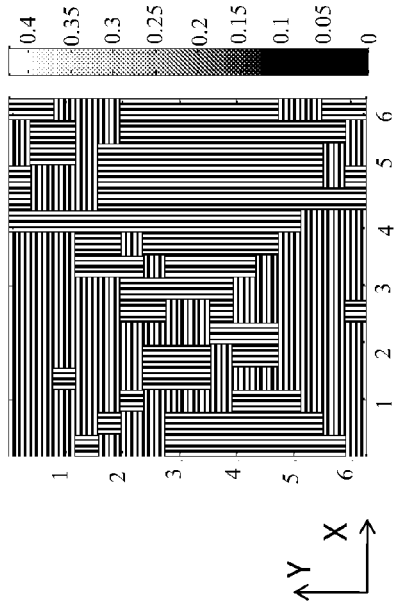
FIG. 4E illustrates a thickness distribution of an anisotropic medium based on FIG. 2A.

FIGS. 4E and 4H illustrate examples of thickness (unit: μm), in the Z direction, of anisotropic mediums and isotropic mediums respectively generated based on the cell structure shown in FIG. 2A. The color density represents the thickness of each cell. A color closer to white indicates a larger thickness, and a color closer to black indicates a smaller thickness. Here, the anisotropic medium 112 is formed from diffraction gratings which generate form birefringence.

To form phase difference $\phi_d$, the thickness $h_{112}$ in the Z direction, of the anisotropic medium 112 needs to satisfy:

$$h_{112} = \frac{\lambda}{n_O - n_E} \frac{\phi_d}{2\pi} \quad (2)$$

where $\lambda$ is a wavelength and $n_O$ and $n_E$ are refractive indices for anisotropic medium. In this example, $\lambda$=193 nm, $n_O$=1.31, and $n_E$=1.19. $n_O$ is a refractive index along the direction of stripes of SWS (Sub-Wavelength Structure). $n_E$ is a refractive index perpendicular to the direction of the stripes.

If the circular polarized light is used as the incident light, the thickness $h_{112}$ can be half as the following equation.

$$h'_{112} = \frac{1}{2} h_{112} \quad (3)$$

This thickness corresponds to performing a function of a QWP. This h112' can be used if the number of phase difference is two.

Japanese Patent Laid-Open No. 2006-196715 discloses a diffraction grating made of fused silica as an example of the diffraction grating which generates form birefringence. According to Japanese Patent Laid-Open No. 2006-196715, when fused silica has a refractive index of 1.56 with respect to a wavelength of 193 nm, and the duty ratio of the diffraction grating in the form birefringence region is 1:1 (=0.5), a refractive index $n_E$ of the diffraction grating in the direction of the pitch is 1.19, and a refractive index $n_O$ of the diffraction grating in a direction perpendicular to the pitch is 1.31.

Figure 4G:
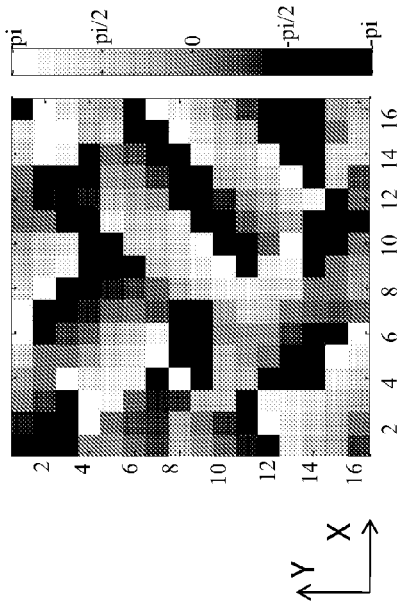
FIG. 4G illustrates a phase distribution for an isotropic medium based on FIG. 2A in consideration of a relative phase shift between anisotropic mediums.

In this example, there exists a relative phase shift of $\pi$/2 between a vertical stripe area and a horizontal stripe area in FIG. 4E. This relative phase shift can be compensated by isotropic medium 114. Regarding X-polarization, a wavefront in the horizontal stripe area delays by $\pi$/2 compared to a wavefront in the vertical stripe area because the wavefront in a medium of a higher refractive index proceeds slower than the wavefront in a medium of a lower refractive index. FIG. 4F illustrates a phase distribution to compensate this phase shift. For each cell, the sum of a value in FIG. 4B and a value in FIG. 4F can form a phase distribution to control the X polarization by the isotropic medium based on FIG. 2A, in consideration of the phase shift. FIG. 4G illustrates the phase distribution $\phi$ obtained by the isotropic medium.

To form phase distribution $\phi$, the thickness $h_{114}$ of the isotropic medium needs to satisfy:

$$h_{114} = \frac{\lambda}{n-1} \frac{\phi}{2\pi} \quad (4)$$

Where n is a refractive index for an isotropic medium. In this example, n=1.56. FIG. 4H illustrates examples of thickness of the isotropic medium including this compensation.

The phase distribution generated by SWS might have a phase distribution inside each cell. This phenomenon might cause reduction of DE. The phase distribution inside each cell can be reduced by using a smaller pitch P. Moreover, it can be reduced by designing phase distributions for the hologram with considering the phase distribution inside each cell.

Although the example 1 has exemplified only the cell structure of the cell structure 100 and the diffraction grating is drawn as floating in the air, the anisotropic cells and isotropic cells can be formed on a substrate, such as fused silica.

The example 1 has exemplified a case in which the computer generated hologram includes some cells, and it is possible to increase the number of cells of the computer generated hologram by decreasing the sizes of pixels which divide the light intensity distribution (target image). The smaller pixels, the more uniform light intensity distribution.

When a hologram is formed by combining a plurality of CGHs described as a separated CGH in the description of the related art, an irradiance variation may occur in the reconstructed image if the optical integrator cannot sufficiently correct the intensity distribution of the incident light (for example, if the light impinges on only some of these CGHs.) According to the example 1, the illumination variation can be decreased.

When a plurality of separated CGHs are combined, unnecessary diffracted light might be generated due to structural discontinuity at the boundary between the separated-CGHs. According to the example 1, a deterioration of the reconstructed image due to the unnecessary diffracted light can be reduced.

The more levels of the anisotropic medium, the more difficult it is to process the anisotropic medium. According to the example 1, the number of anisotropic medium levels is one, and the number of isotropic medium levels is substantially infinite. Therefore, while realizing a high DE, difficulty of fabrication can be reduced in light of processing the anisotropic medium.

Figure 5:
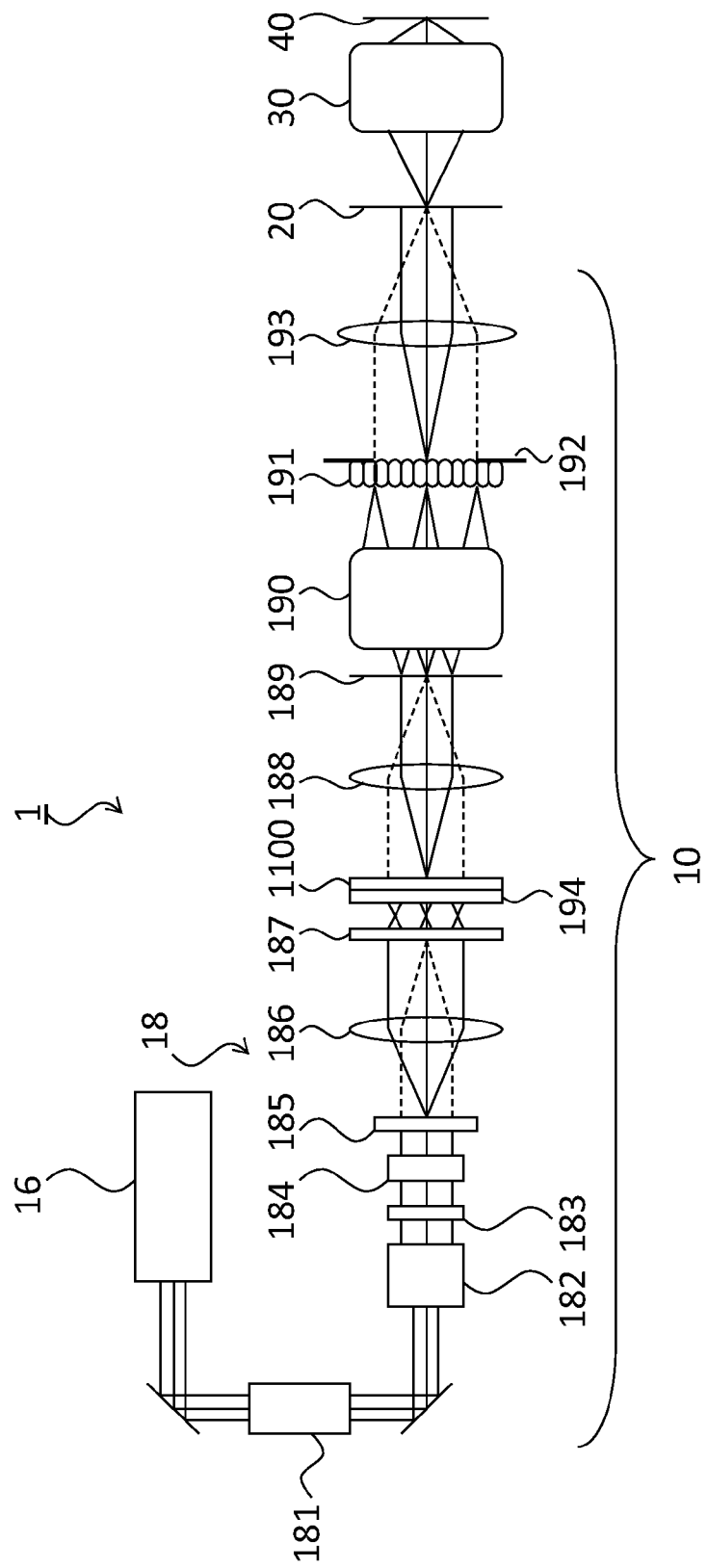
FIG. 5 illustrates a composition of an exposure apparatus according to one aspect of the present invention.

An exposure apparatus 1 to which the hologram 1100 is applied will be explained below with reference to FIG. 5. FIG. 5 illustrates an exemplary arrangement of the exposure apparatus 1.

The exposure apparatus 1 is a projection exposure apparatus which transfers the pattern of a reticle 20 onto a wafer 40 by the step & scan scheme. However, the exposure apparatus 1 can adopt the step & repeat scheme or another exposure scheme.

As shown in FIG. 5, the exposure apparatus 1 includes an illumination apparatus 10, a reticle stage (not shown) for supporting the reticle 20, a projection optical system 30, and a wafer stage (not shown) for supporting the wafer 40.

The illumination apparatus 10 illuminates the reticle 20 on which a circuit pattern to be transferred is formed, and includes a light source 16 and illumination optical system 18.

The light source 16 is, for example, an excimer laser such as an ArF excimer laser with a wavelength of about 193 nm or a KrF excimer laser with a wavelength of about 248 nm. However, the light source 16 is not particularly limited to an excimer laser, and may be, for example, an $F_2$ laser with a wavelength of about 157 nm or a mercury lamp with a narrow wavelength range.

The illumination optical system 18 illuminates the reticle 20 with light from the light source 16, and performs modified illumination on the reticle 20 in a predetermined polarization state while ensuring a predetermined illuminance. In this example, the illumination optical system 18 includes a light extension optical system 181, beam shaping optical system 182, polarization controller 183, phase controller 184, exit angle saving optical element 185, relay optical system 186, multibeam generation unit 187, polarization state adjusting unit 194, and the hologram 1100. The illumination optical system 18 also includes a relay optical system 188, aperture 189, zoom optical system 190, multibeam generation unit 191, aperture stop 192, and irradiation unit 193.

The light extension optical system 181 deflects light from the light source 16 to guide it to the beam shaping optical system 182. The beam shaping optical system 182 shapes the section of the light from the light source 16 into a desired shape by converting the horizontal to vertical ratio of the section of the light from the light source 16 into a desired value (e.g., by changing the sectional shape from a rectangle to a square). The beam shaping optical system 182 forms a light beam with a size and an angle of divergence which are required to illuminate the multibeam generation unit 187.

The polarization controller 183 includes, for example, a linear polarizer and has a function of removing unnecessary polarized light components. It is possible to efficiently convert light from the light source 16 into desired linearly polarized light by minimizing polarized light components removed (shielded) by the polarization controller 183.

The phase controller 184 converts the linearly polarized light obtained by the polarization controller 183 into circularly polarized light by giving a phase difference of $\lambda/4$ to it.

The exit angle saving optical element 185 includes, for example, an optical integrator (e.g., a fly-eye lens or fiber bundle including a plurality of microlenses), and outputs the light at a predetermined angle of divergence.

The relay optical system 186 converges the light which emerges from the exit angle saving optical element 185 on the multibeam generation unit 187. The relay optical system 186 adjusts the exit surface of the exit angle saving optical element 185 and the incident surface of the multibeam generation unit 187 to hold the Fourier transform relationship (the relationship between the object plane and the pupil plane or that between the pupil plane and the image plane).

The multibeam generation unit 187 includes an optical integrator (e.g., a fly-eye lens or fiber bundle including a plurality of microlenses) for uniformly illuminating the polarization state adjusting unit 194 and computer generated hologram 100. The exit surface of the multibeam generation unit 187 forms a light source surface including a plurality of point light sources. The light which emerges from the multibeam generation unit 187 impinges on the polarization state adjusting unit 194 as circularly polarized light.

The polarization state adjusting unit 194 converts the circularly polarized light obtained by the phase controller 184 into linearly polarized light having a desired polarization direction by giving a phase difference of $\lambda/4$ to it. The light which emerges from the polarization state adjusting unit 194 impinges on the computer generated hologram 100 as linearly polarized light.

More specifically, in one example, the incident light generated from the light source 16 might include X and Y-polarizations, and an amplitude of X-polarization might be equal to an amplitude of Y-polarization.

The hologram 1100 forms a light intensity distribution (e.g., a light intensity distribution LI as shown in FIG. 1A) at the position of the aperture 189 via the relay optical system 188. The hologram 1100 can take any of the above-described forms, and a detailed description thereof will not be given here.

The aperture 189 has a function of passing only a light intensity distribution formed by the hologram 1100. The computer generated hologram 1100 and aperture 189 are set to hold the Fourier transform relationship.

The zoom optical system 190 enlarges a light intensity distribution formed by the hologram 1100 at a predetermined magnification, and projects it onto the multibeam generation unit 191.

The multibeam generation unit 191 is inserted on the pupil plane of the illumination optical system 18, and forms, on its exit surface, a light source image (effective light source distribution) corresponding to the light intensity distribution formed at the position of the aperture 189. In this example, the multibeam generation unit 191 includes an optical integrator such as a fly-eye lens or cylindrical lens array. The aperture stop 192 is inserted near the exit surface of the multibeam generation unit 191.

The irradiation unit 193 includes, for example, a condenser optical system and illuminates the reticle 20 with an effective light source distribution formed on the exit surface of the multibeam generation unit 191.

The reticle 20 has a circuit pattern and is supported and driven by the reticle stage (not shown). Diffracted light generated by the reticle 20 is projected onto the wafer 40 via the projection optical system 30. Since the exposure apparatus 1 is of the step & scan scheme, it transfers the pattern of the reticle 20 onto the wafer 40 by scanning them.

The projection optical system 30 projects the pattern of the reticle 20 onto the wafer 40. The projection optical system 30 can be a dioptric system, catadioptric system, or catoptric system.

The wafer 40 is a substrate onto which the pattern of the reticle 20 is projected (transferred), and is supported and driven by the wafer stage (not shown). However, it is also possible to use a glass plate or another substrate in place of the wafer 40. The wafer 40 is coated with a resist.

As described above, the computer generated hologram 1100 does not give a phase distribution to the wavefront of light polarized in a single direction, but two-dimensionally gives different phase distributions to the wavefronts of both X-polarization and Y-polarization. This makes it possible to form a light intensity distribution LI almost without generating any loss in light amount.

In exposure, light emitted by the light source 16 illuminates the reticle 20 by the illumination optical system 18. The light which bears the information of the pattern of the reticle 20 forms an image on the wafer 40 by the projection optical system 30. The illumination optical system 18 used for the exposure apparatus 1 can suppress any illumination variation and loss in light amount, and form a light intensity distribution with a desired shape and polarization state by the hologram 1100. Hence, the exposure apparatus 1 can provide high-quality devices (e.g., a semiconductor device, an LCD device, an image sensing device (e.g., a CCD), and a thin-film magnetic head) with a high throughput and a good economical efficiency.

Example 2

Random Distribution of Phase Difference with Birefringence Material

Figure 6:
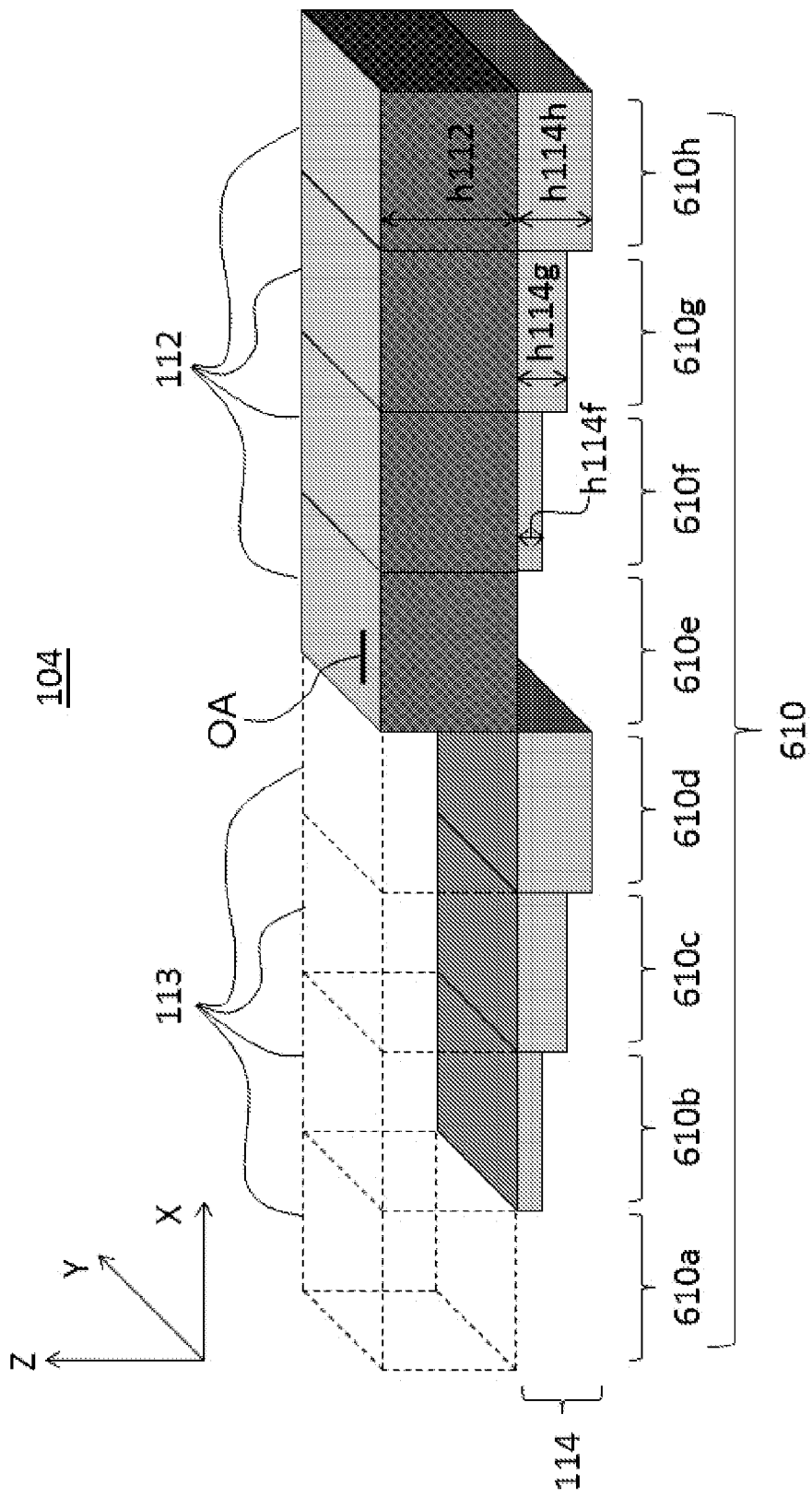
FIG. 6 is a perspective view showing a cell structure having a birefringence material.

FIG. 6 illustrates a perspective view showing a cell structure 104, whose anisotropic medium is a birefringence material. 610*a* to 610*h* indicate examples of each cell. The thickness of some of anisotropic mediums or isotropic mediums is zero. FIG. 6 shows an example of that the number of phase difference is two. The structure in FIG. 6 is designed for a linearly polarized light as the incident light. In this example, the polarization direction of the incident light with respect to the X-axis is +45° shown in FIG. 12A. The space 113 in FIG. 6 can be used for a refractive index matching medium. If the space 113 is filled with the index matching medium whose refractive index is the same as one of refractive indices of an anisotropic medium, a combination of the anisotropic medium and the index matching medium looks like a plane glass for one polarization, and the combination looks like a grating of a half wave plate (HWP) for the other polarization.

Figures 7A, 7B:
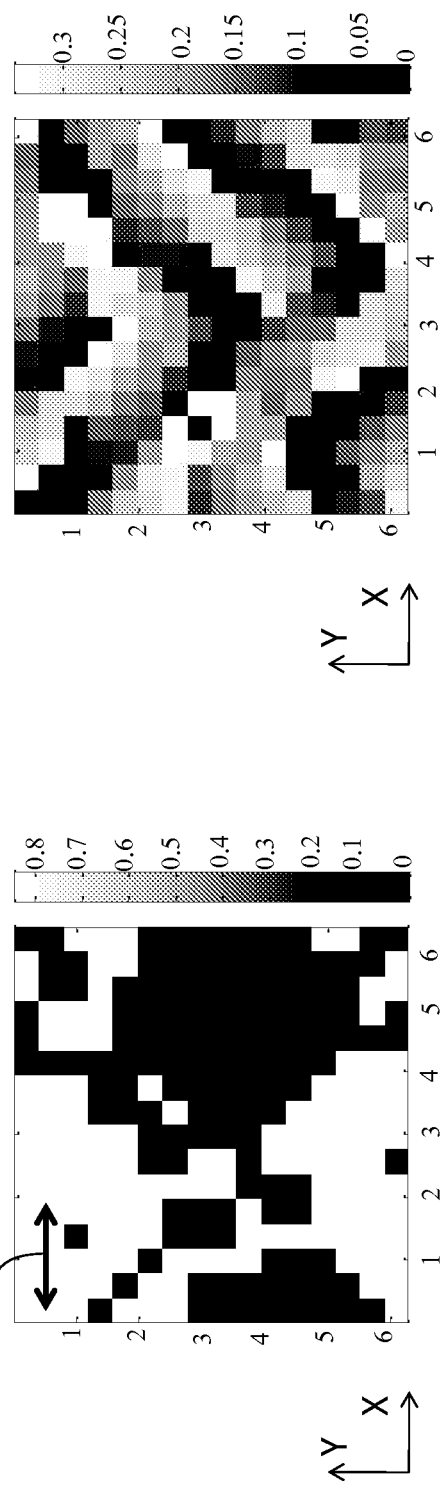
FIGS. 7A and 7B illustrate thickness distributions of an anisotropic medium and an isotropic medium based on FIG. 6, respectively.

The target image in FIG. 4A is also used in this example. FIGS. 7A and 7B illustrate examples of thickness of an anisotropic medium and an isotropic medium respectively based on FIG. 6. The hologram data for X and Y polarizations are FIGS. 4B and 4C, respectively.

FIG. 7A shows the thickness of the anisotropic medium calculated by using parameters that $\lambda=193$ nm, $n_O=1.31$, and $n_E=1.19$. This thickness corresponds to performing a function of an HWP.

If the space 113 in FIG. 6 is filled with an index matching medium whose refractive index is the same as one of refractive indices of the anisotropic medium, one of phase distributions shown in FIGS. 4B and 4C can be used as hologram data for the isotropic medium. In this example, $n_E$ is used for the refractive index of the refractive index matching medium. Then, a combination of the anisotropic medium and the index matching medium looks like a plane glass for X-polarization, and the combination looks like a grating of a HWP for Y-polarization. Therefore, the phase distribution for the isotropic medium in this example is the FIG. 4B. If the index matching medium is used, a sensitivity caused by thickness error can be reduced by $1/n_E$ time. FIG. 7B shows the thickness of the isotropic medium with refractive index $n=1.56$.

Although this embodiment has exemplified only the cell structure of the hologram 1100, the above-described anisotropic cells and isotropic cells can be formed on a substrate.

In FIG. 6, a direction along the optic axis OA for the anisotropic medium of every cell coincides with each other. Therefore, all anisotropic mediums in hologram 1100 might be formed on a substrate made of the same anisotropic medium, and all isotropic mediums might be formed on a substrate made of the same isotropic medium. More specifically, the substrate made of the anisotropic medium is located at the upper-side of the plurality of cells 1110, and the substrate made of the isotropic medium is located at the bottom-side of the plurality of cells 1110. In FIG. 6, the anisotropic medium and the isotropic medium are in contact with each other, but they also might be separated from each other along Z-direction. Moreover, 4f system might exist between the anisotropic medium and the isotropic medium, and they might be located at conjugate surfaces of the 4f system.

The 4f system means one of an imaging system. The length of the system is 4f long as the focal length of the Fourier transform (FT) lens, which is used in the system, is f. From the edge of the system, an object plane, the FT lens, an FT plane, the FT lens, and an image plane are located at regular intervals. In this example, the anisotropic medium and the isotropic medium might be at the object plane and the image plane respectively.

The optic axis of the anisotropic medium means the direction in which no birefringence occurs, because the refractive indices in all directions perpendicular to a propagation direction of an incident light are constant. In other words, ordinary and extraordinary rays match each other or have a minimum deviation.

Ideally, the anisotropic substrate should be flat, and should have the thickness obtained by multiplying a thickness corresponding to performing a function of an HWP by 2n (n represents an integer) in order not to cause an unexpected phase difference by an anisotropic substrate. However there might exist wedge error, which is that both surfaces of the substrate are flat, but they are not parallel. There also might exist thickness error, which is that the thickness differs from the ideal value. These errors might be compensated by adjusting the incident light.

A quick look test setup (QLTS) is an apparatus including a light source, and an illumination optical system including the hologram.

The QLTS 115 to which the hologram 1100 including the anisotropic 112 medium and the isotropic medium 114 is applied will be explained below with reference to FIG. 8. The QLTS is used to confirm whether a hologram can form the reconstructed image in the predetermined plane PS.

The light source 116 is a HeNe laser with a wavelength of about 633 nm. The power ratio of X and Y-polarizations of the light is controlled with a polarizer 117. In this example, the polarization direction with respect to the X-axis is +45° if a compensator 120 doesn't change an intensity ratio of X and Y-polarization.

A compensator 120 adjusts an incident light for hologram 1100. The compensator 120 includes polarization beam splitters (PBSs) 122*a* and 122*b*, a first tip-tilt mirror 124, and a second tip-tilt mirror with a piezoelectric material 126. The compensator 120 adjusts the incident light for the hologram 1100 so that the wedge error and the thickness error of the anisotropic substrate or other polarization-specific aberrations of the system can be canceled. The isotropic substrate 812 and the anisotropic substrate 814 are described separately. A reference number 130 in FIG. 8 indicates lenses for the 4f system.

Figure 12B:
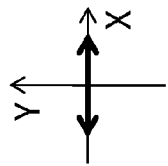
FIGS. 12A and 12B illustrate polarization directions of an incident light, respectively.
Figure 12D:
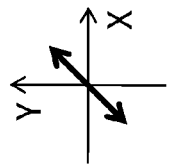
FIGS. 12C and 12D illustrate directions of an optic axis, respectively.
Figure 12F:
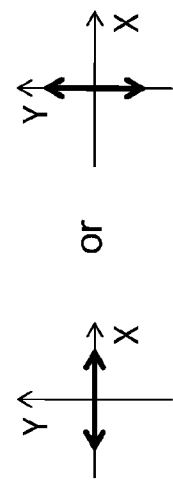
FIGS. 12E and 12F illustrate polarization directions of light output from a hologram.
Figure 12A:
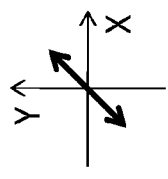

For example, how to make a linearly polarized light and the polarization direction with respect to the X-axis is +45° shown in FIG. 12A as an incident light is explained here. The first PBS 122*a* divides the light coming from the light source into X-polarization for the hologram (a transverse magnetic wave) and Y-polarization (a transverse electric wave). X-polarization is reflected by PBSs, and Y-polarization goes through PBSs. The second PBS 122*b* combines both polarizations to make the incident light for the hologram. If the optical path for X and Y-polarizations are symmetric including the condition that the lengths of both optical paths are the same as each other, and if a compensator 120 doesn't change an intensity ratio of X and Y-polarization, the same polarization state after the polarizer 117 is formed as the incident light for the hologram. Generally, the polarization state after the polarizer 117 might be the same as an expected incident light for the hologram. By adjusting the first tip-tilt mirror 124 and second the tip-tilt mirror 126 with a piezoelectric material, the polarization state can be changed from the polarization state after the polarizer 117, so that the incident light can be calibrated to cancel the wedge error and the thickness error caused by anisotropic substrate 814 or other optical elements (not shown in FIG. 8) between 117 and 812 that introduce polarization aberrations. Other forms of the polarization compensator can include, for example, mechanically and/or electrically addressable anisotropic material.

The compensated incident light illuminates hologram 800. The light diffracted by the hologram 800 goes through a Fourier transform lens 132, and forms a reconstructed image in the predetermined plane PS. In order to analyze the direction of polarization for the reconstructed image, an analyzer 134 is located between the hologram 800 and the predetermined plane.

FIGS. 9A to 9D present reconstructed images by using analyzers in directions of 0, 45, 90 and 135 degree(s) with respect to an X-axis in the experiment. In the experiment, $\lambda=633$ nm, $n_O=1.656$, $n_E=1.485$, and n=1.598 are used. The material of the birefringence material is calcite ($CaCO_3$), and the thickness is 1.85 [μm], which can be calculated by equation (2) (above). The matching oil equals to $n_E$. The number of cells is 512 by 512. The number of phase difference levels is two, and the number of phase levels is 128. In each FIGS. 9A to 9D, a component in the circumferential direction of concentric circles about the optical axis is observed. Therefore, the reconstructed image is formed by mainly S-polarized light.

Example 3

Interlaced Distribution of Phase Difference I

Another detailed example of a computer generated hologram as the hologram 1100 will be explained below.

From the viewpoint of fabrication, arrayed distribution of the phase difference might be better than random distribution (e.g., FIG. 4D). In this example, an interlaced distribution of a phase difference in FIG. 10A is used as the arrayed distribution. The phase difference of the hologram, which includes a plurality of cells, comprises 0 (zero) and π in alternate arrangement.

The target image to be used in this example is shown in FIG. 10B. This target image consists of S-polarization.

FIGS. 10C and 10D illustrate phase distributions for X and Y-polarizations respectively designed as hologram data. These phase distributions are designed under the condition that the phase difference distribution in FIG. 10A is kept.

Figure 10E:
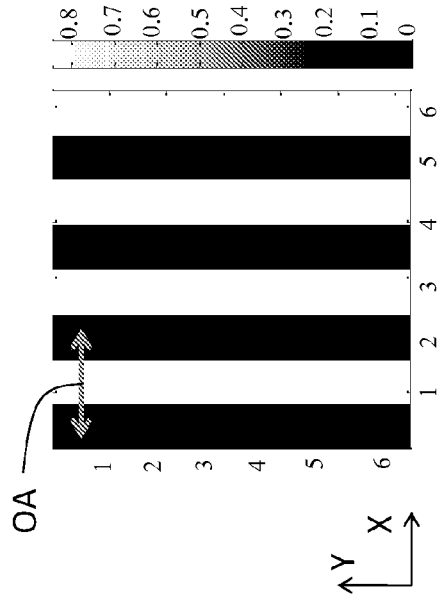
FIG. 10E illustrates a phase difference distribution of the computer generated holograms corresponding to FIGS. 10C and 10D.

FIG. 10E illustrates a phase difference between X and Y-polarizations, which is obtained by subtracting a value of a phase of each cell in FIG. 10C from a value of a phase corresponding to the cell in FIG. 10D. This distribution is the same as the condition FIG. 10A, which means that the condition was maintained correctly in the iteration loop of design.

Figure 10F:
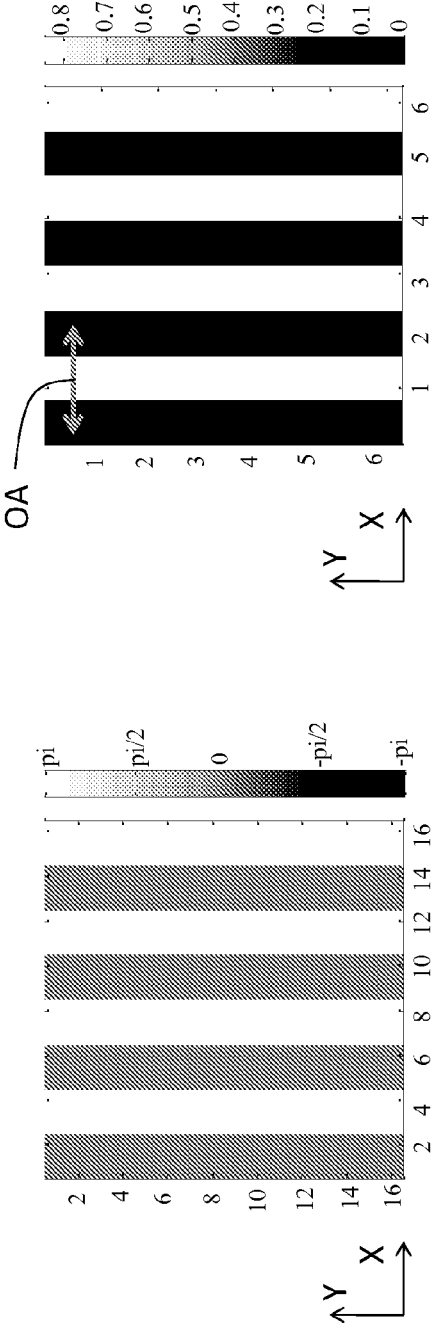
FIGS. 10F and 10G illustrate thickness distributions of an anisotropic medium and an isotropic medium, respectively.
Figure 10G:
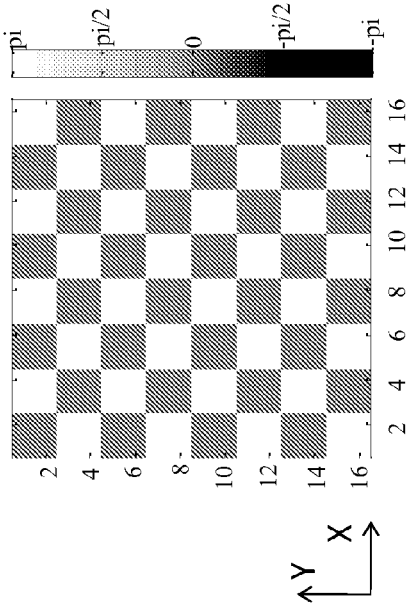

FIGS. 10F and 10G illustrate examples of thickness of the anisotropic medium and the isotropic medium respectively based on FIG. 6. In this example, $\lambda=193$ nm, $n_O=1.31$, $n_E=1.19$, and n=1.56. The optic axis in the anisotropic medium is along X-axis, and the refractive index of the matching oil is the same $n_E$. The thickness distribution in FIG. 10G corresponds to the phase distribution in FIG. 10C.

FIG. 10E indicates the phase difference of the hologram comprising the plurality of cells is 0 and π in alternate arrangement.

Figure 10H:
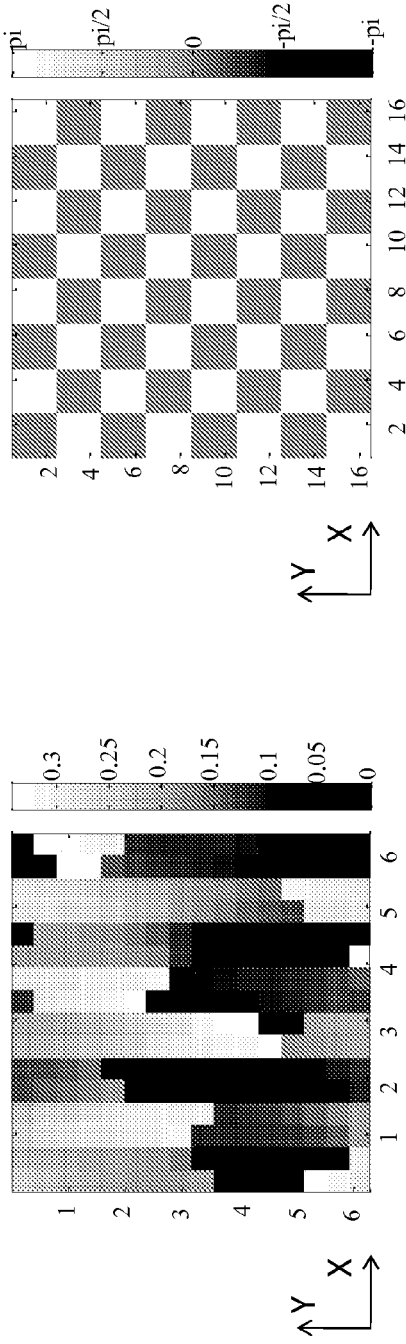
FIG. 10H illustrates another example of a phase difference distribution of a computer generated hologram for X and Y-polarizations.

The arrayed distribution for the phase difference is not limited to the interlaced distribution illustrated in FIG. 10A. FIG. 10H illustrates another example of the arrayed distribution. FIG. 10H indicates that the phase difference distribution is a checkered pattern.

Example 4

Interlaced Distribution of Phase Difference II

The other detailed example of a computer generated hologram as the hologram 1100 will be explained below. This example can be thought of as another design method of example 3.

Figure 11B:
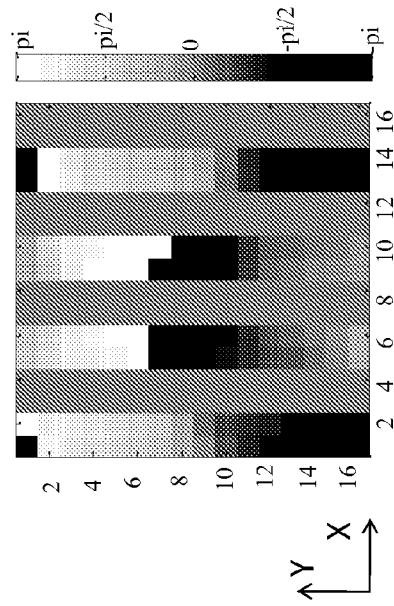
FIGS. 11B and 11C illustrate phase distributions of computer generated holograms for X and Y-polarizations, respectively.
Figure 11A:
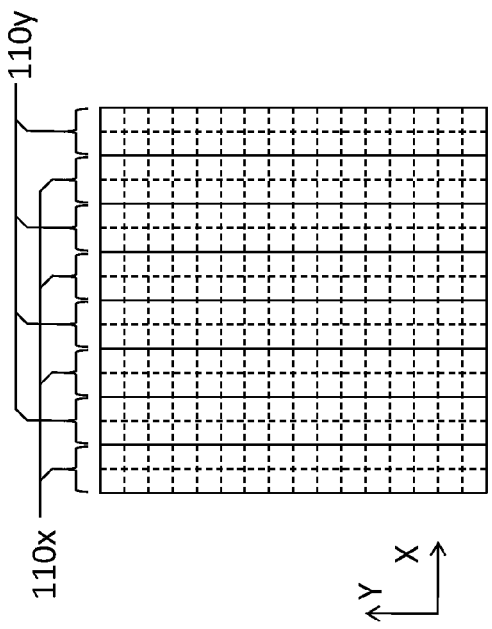
FIG. 11A illustrates areas separated for X and Y-polarizations in the hologram plane.

In this example, the area for X and Y-polarizations in the hologram plane is separated as shown FIG. 11A. For example, the first and second columns are cells for X-polarization 110x, and the third and fourth columns are cells for Y-polarization 110y, and so on.

In this example, the interlaced distribution in FIG. 10A is also used as the arrayed distribution. The target image FIG. 10B is also used.

Figure 11C:
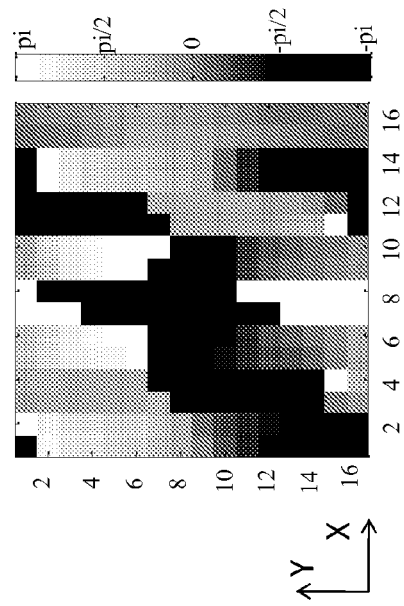
Figure 11D:
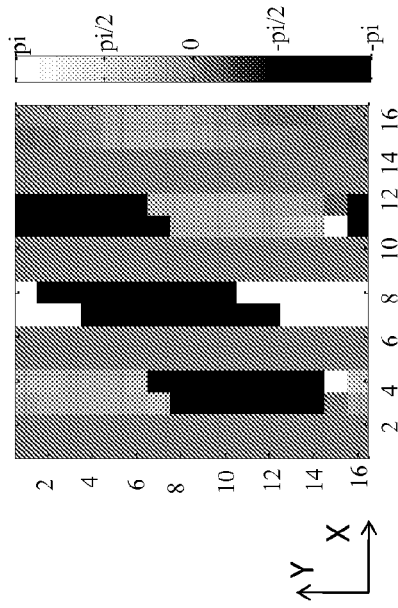
FIG. 11D illustrates a combined phase distributions based on FIGS. 11B and 11C.
Figure 11E:
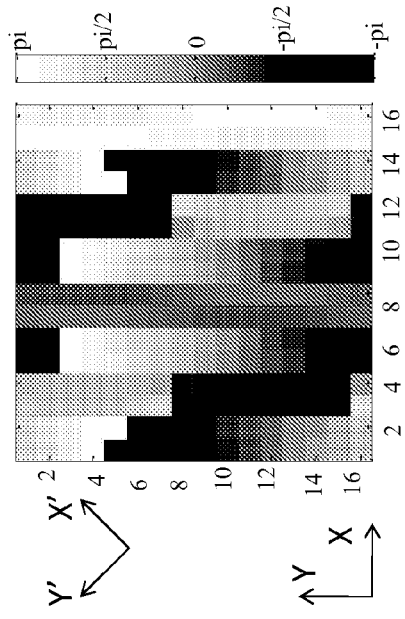
FIG. 11E illustrates a phase distribution of a computer generated hologram for X'-polarization.

FIGS. 11B and 11C illustrate one example of phase distributions for X and Y-polarizations respectively during iteration for a hologram design. They are combined as FIG. 11D in each iteration loop. FIG. 11E illustrates one example of the designed hologram.

Figure 13:
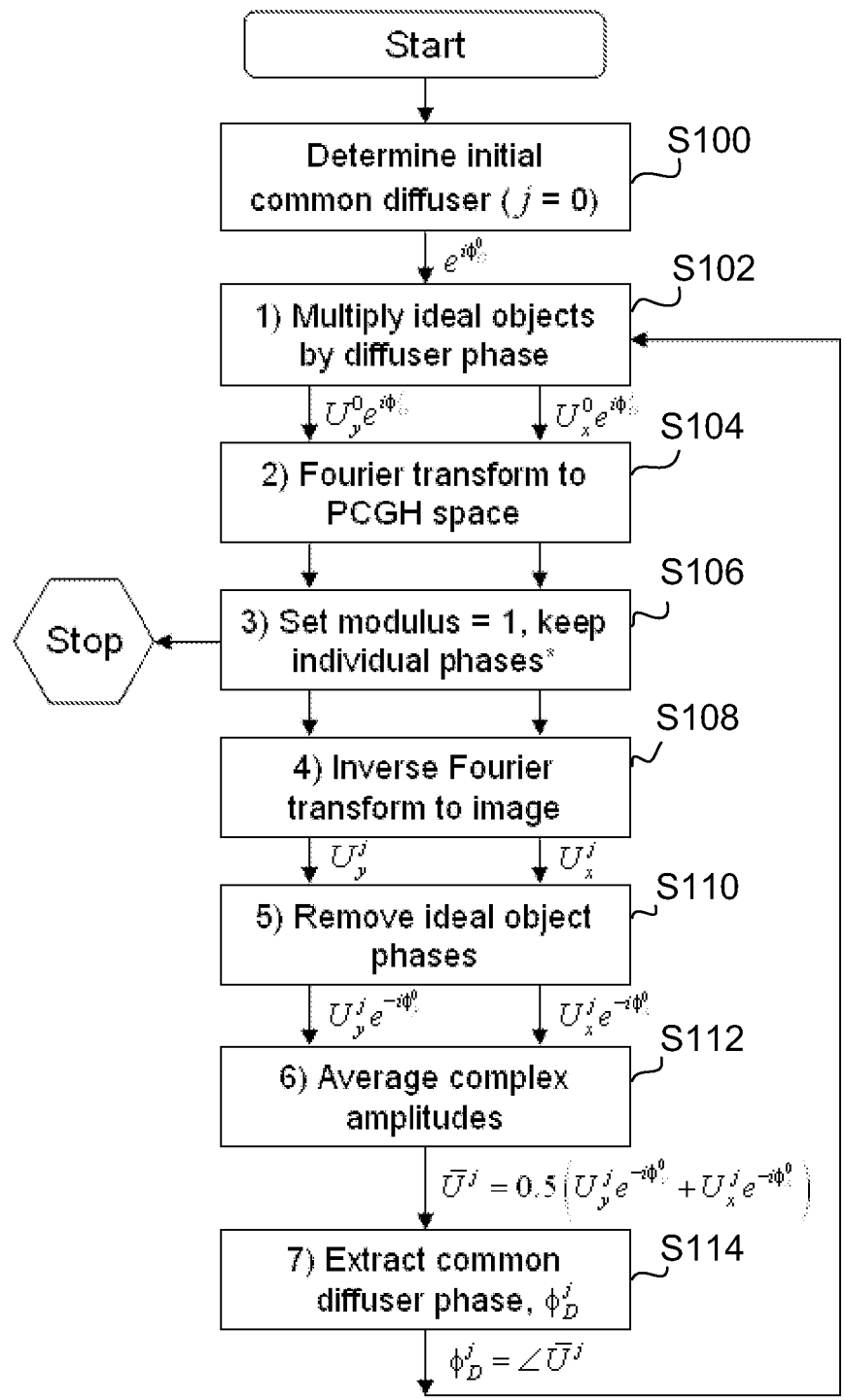
FIG. 13 illustrates a flowchart of the design method.

A flowchart of the design method is shown in FIG. 13, which is a modified Gerchberg-Saxton technique. In S100, an initial common diffuser is defined as an array of uniformly random phase pixels over $[-\pi, \pi]$. The diffuser means that a phase distribution on the predetermined plane consists of a random phase. In other words, the diffuser means that the phase distribution has a plurality of spatial frequencies. In the first step (S102) of the calculation loop, ideal images defined by Eqs. (5) and (6) (above) are multiplied by the diffuser to create two target images multiplied by the diffuser (x and y) for the calculation. In the second step (S104), Fourier transforms are applied to each image, which converts the calculation into the hologram plane. In the third step (S106), the modulus of each transform is set to unity. In other words, the amplitude of each transformed complex amplitude is set to unity. In the fourth step (S108), inverse Fourier transforms are applied to the phase distributions of the results from the third step (S106), which bring the calculation back into the predetermined plane. Ideal object phases $\phi_x^0$ and $\phi_y^0$ are then removed from image estimates $U_x^1$ and $U_y^1$ in the fifth step (S110). In the sixth step (S112), the resulting complex amplitudes are averaged to produce $\bar{U}^1$. The common diffuser phase $\phi_D^1$ is extracted in the seventh step (S114). The common diffuser phase $\phi_D^1$ is simply the phase angle of (T. For the next loop (j=2), $\phi_D^1$ is used as the starting point for the diffuser in the first step (S102). Processing shown in FIG. 13 stops after a number of loops, typically 50 loops, when the diffuser converges to produce acceptable characteristics of image estimates $U_x^j$ and $U_y^j$, when the phases calculated in the third step (S106) are used as the individual components of the PCGH. Optional operations can be performed at the third step (S106) during the calculation, for example, applying an aperture function for the DOE or introducing phase quantization.

$$U_x^0(r,\theta)=A_x^0(r,\theta)e^{i\phi_x^0(r,\theta)}=-\sin\theta g_S(r,\theta) \quad (5)$$

$$U_y^0(r,\theta)=A_y^0(r,\theta)e^{i\phi_y^0(r,\theta)}=\cos\theta g_S(r,\theta) \quad (6)$$

Figure 11F:
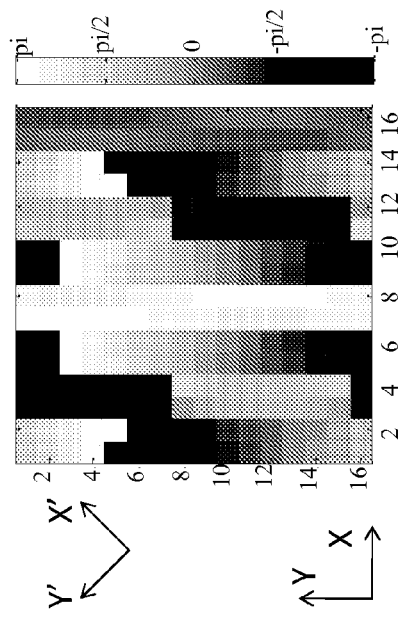
FIG. 11F illustrates a phase distribution of a computer generated hologram for Y'-polarization.
Figure 11G:
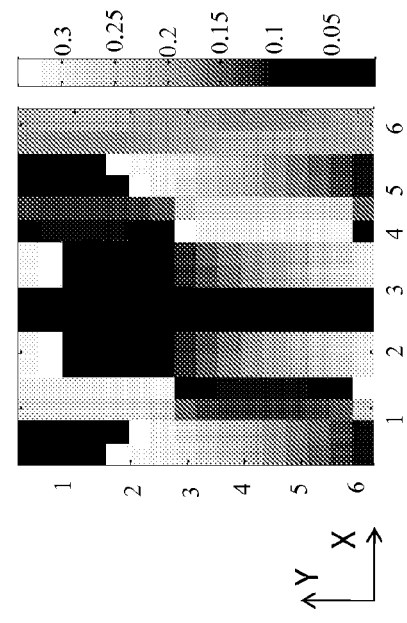
FIGS. 11G and 11H illustrate thickness distributions of an anisotropic medium and an isotropic medium, respectively.

To illuminate the hologram with the condition as FIG. 11A, the anisotropic medium illustrated in FIG. 11G can be used. The optic axis is along the direction of +45° with respect to an X-axis as shown FIG. 12D.

The incident light is a linearly polarized light and the polarization direction is along the X-axis shown in FIG. 12B.

Figure 11H:
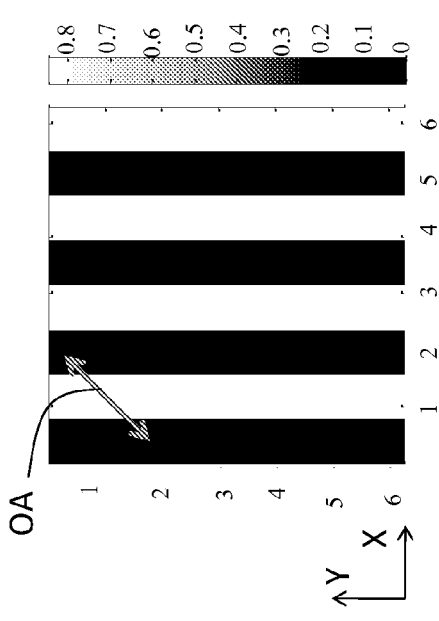

FIGS. 11G and 11H illustrate examples of thickness of the anisotropic medium and the isotropic medium respectively based on FIG. 6. In this example, λ=193 nm, $n_O$=1.31, $n_E$=1.19, and n=1.56. The optic axis in the anisotropic medium is along X-axis, and the refractive index of the matching oil is the same $n_E$.

Figure 12C:
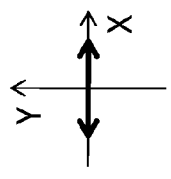
Figure 12E:
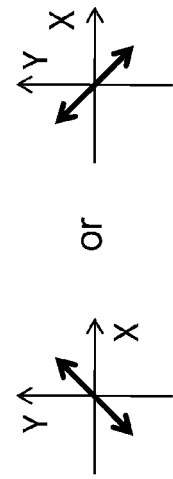

FIGS. 12A and 12B illustrate the polarization direction of the incident light in the examples 3 and 4 respectively. FIGS. 12C and 12D illustrate the direction of the optic axis in the examples 3 and 4, respectively. FIGS. 12E and 12F illustrate the polarization direction of the light exited from the hologram in the examples 3 and 4 respectively.

All angles in this example are rotated with 45 degrees from the angles in the example 3. Here, X' is defined as whose direction of +45° with respect to an X-axis as drawn in FIG. 11E. Y' is defined as whose direction of +45° with respect to a Y-axis as drawn in FIG. 11E. X' and Y'-polarization, which are the linearly polarized light along X and Y-axes respectively, can be thought as the third and fourth polarized light components respectively. With this rotation, the phase distribution shown in FIG. 11F is obtained by adding the phase difference shown in FIG. 10A to the phase distribution in FIG. 11E. FIGS. 11E and 11F can be thought as phase distribution for X' and Y'-polarization. FIG. 10A can be thought as phase difference distribution between X' and Y'-polarization.

Figure 8:
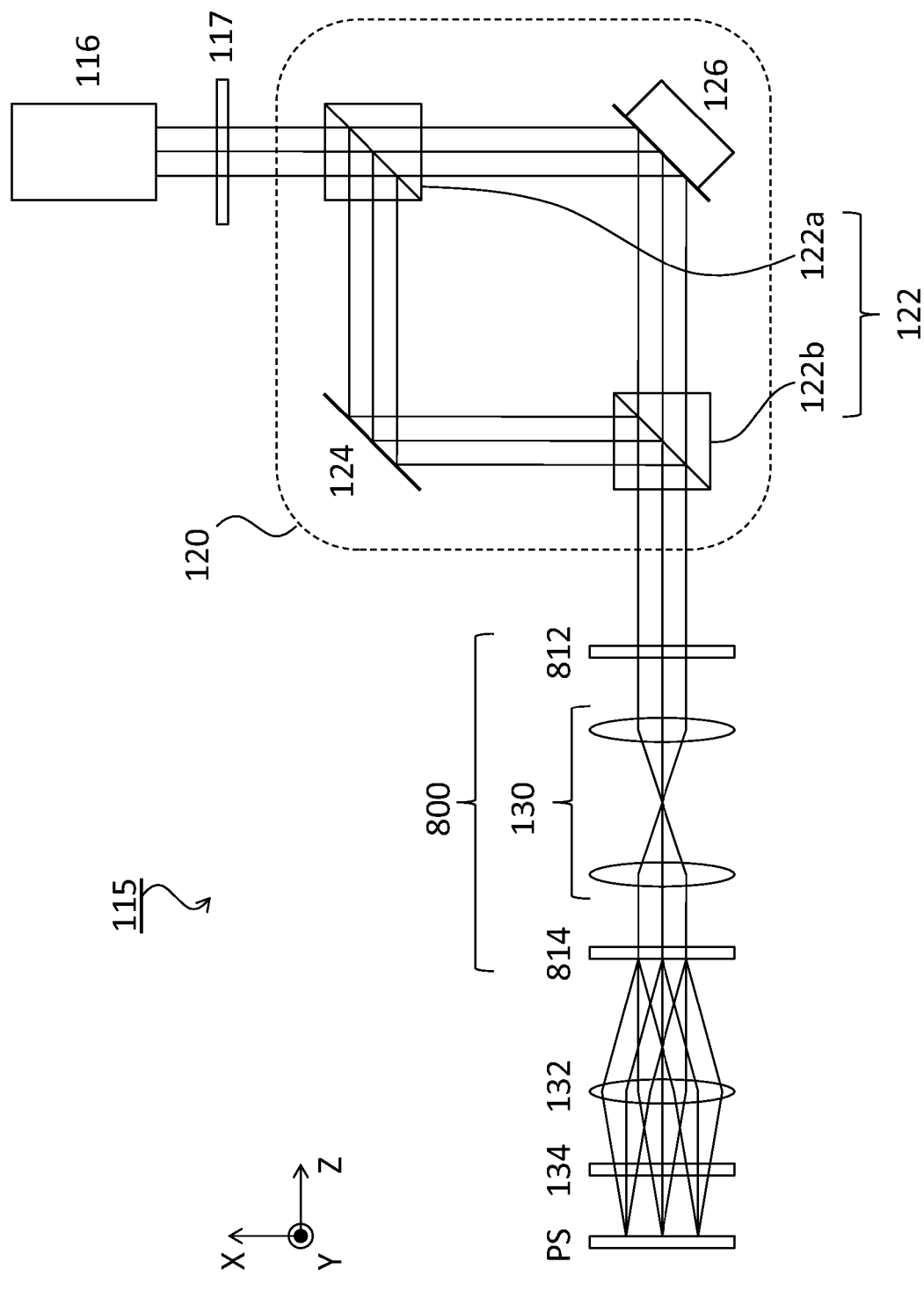
FIG. 8 illustrates an apparatus including a compensator.
Figure 9A:
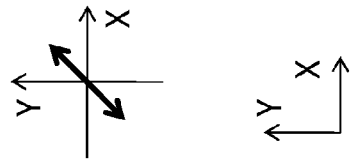
FIG. 9A to 9D show reconstructed images by using analyzers in directions of 0, 45, 90 and 135 degree(s) with respect to an X-axis, respectively.
Figure 9A:
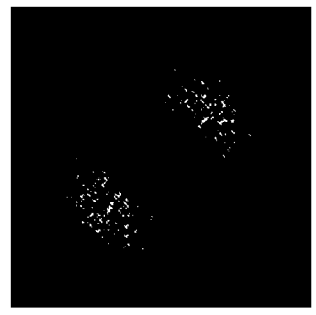
Figure 9B:
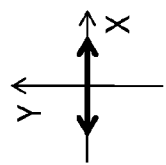
Figure 9B:
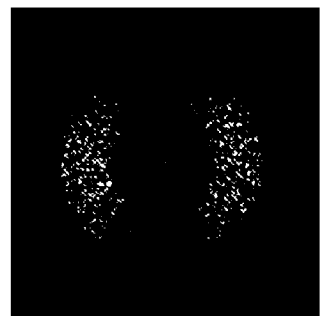
Figure 9C:
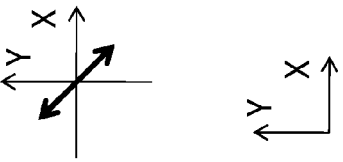
Figure 9C:
Figure 9D:
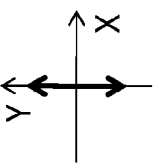
Figure 9D:
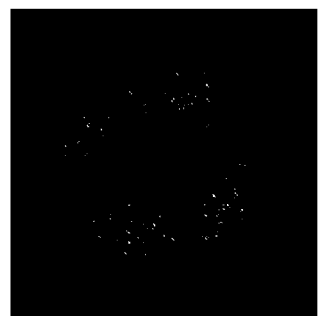

If the hologram in FIGS. 11G and 11H are tested with QLTS, the hologram is rotated so that X' axis and Y' axis in FIGS. 11E and 11F are on X axis and Y axis in FIG. 8.

X' and Y' in this example can be thought as X and Y in the example 3. Therefore, this example can be thought as another design method. Example 3 is also considered as that CGHs generated for X' and Y'-polarizations are combined.

In this example, the area for X and Y-polarizations in the hologram plane is separated by using the anisotropic medium shown in FIG. 11G. Instead of using the anisotropic medium, two Ronchi gratings can be used. The Ronchi grating means that the area whose transmittance is 1 and the area whose transmittance is 0 are arrayed alternately. One Ronchi grating might be located at one path (e.g., the path for a transverse magnetic wave) in the compensator in FIG. 8. Another Ronchi grating might be located at the other path (e.g., the path for a transverse electric wave) in the compensator in FIG. 8.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A hologram which forms a light intensity distribution on a predetermined plane by using incident light, the hologram comprising:
   a plurality of cells configured to control both a phase of a first polarized light component in a first polarization direction of the incident light and a phase of a second polarized light component in a second polarization direction perpendicular to the first polarization direction, to form a phase difference distribution between phase distributions for the first and second polarized light components,
   wherein the plurality of cells comprises an isotropic medium and an anisotropic medium,
   wherein the phase distribution of the first polarized light component and the phase distribution of the second polarized light component are designed so that a number of phase difference levels of the phase difference distribution is less than a number of phase levels of the phase distribution of the first polarized light component, and
   wherein the plurality of cells is formed in the hologram based on the phase distribution of the first polarized light component and the phase distribution of the second polarized light component which are designed so that the number of phase difference levels of the phase difference distribution is less than the number of phase levels of the phase distribution of the first polarized light component.

2. The hologram according to claim 1, wherein the anisotropic medium comprises a sub-wavelength structure.

3. The hologram according to claim 1, wherein the anisotropic medium comprises a birefringence material.

4. The hologram according to claim 1, wherein the phase difference distribution comprises a phase difference value of 0 and pi in alternate arrangement.

5. The hologram according to claim 1, wherein the phase difference distribution comprises an interlaced distribution.

6. The hologram according to claim 1, wherein the phase difference distribution comprises an interlaced distribution with alternating values of 0 and pi.

7. The hologram according to claim 1, wherein the phase difference distribution comprises a checkered distribution.

8. The hologram according to claim 1, wherein the plurality of cells is divided into alternating columns of a third polarized light component and a fourth polarized light component perpendicular to the third polarized light component.

9. The hologram according to claim 8, wherein polarization directions of the third and fourth polarized light components correspond to directions obtained by rotating the first and second polarization directions by 45 degrees, respectively.

10. The hologram according to claim 1, wherein the number of phase difference levels is two.

11. The hologram according to claim 1, wherein the number of phase levels is more than two.

12. An apparatus comprising:
   a light source, and an illumination optical system including a hologram which forms a light intensity distribution on a predetermined plane by using incident light, the hologram comprising:
   a plurality of cells configured to control both a phase of a first polarized light component in a first polarization direction of the incident light and a phase of a second polarized light component in a second polarization direction perpendicular to the first polarization direction, to form a phase difference distribution between phase distributions for the first and second polarized light components,
   wherein the plurality of cells comprises an isotropic medium and an anisotropic medium,
   wherein the phase distribution of the first polarized light component and the phase distribution of the second polarized light component are designed so that a number of phase difference levels of the phase difference distribution is less than a number of phase levels of the phase distribution of the first polarized light component, and
   wherein the plurality of cells is formed in the hologram based on the phase distribution of the first polarized light component and the phase distribution of the second polarized light component which are designed so that the number of phase difference levels of the phase difference distribution is less than the number of phase levels of the phase distribution of the first polarized light component.

13. The apparatus according to claim 12, further comprising an incident light compensator including polarization beam splitters and tip-tilt mirrors.

14. An exposure apparatus comprising:
an illumination optical system configured to illuminate a reticle with a light source, the illumination optical system including a hologram which forms a light intensity distribution on a predetermined plane by using incident light; and
a projection optical system configured to project a pattern of the reticle onto a substrate,
wherein the hologram comprises:
a plurality of cells configured to control both a phase of a first polarized light component in a first polarization direction of the incident light and a phase of a second polarized light component in a second polarization direction perpendicular to the first polarization direction, to form a phase difference distribution between phase distributions for the first and second polarized light components,
wherein the plurality of cells comprises an isotropic medium and an anisotropic medium,
wherein the phase distribution of the first polarized light component and the phase distribution of the second polarized light component are designed so that a number of phase difference levels of the phase difference distribution is less than a number of phase levels of the phase distribution of the first polarized light component, and
wherein the plurality of cells is formed in the hologram based on the phase distribution of the first polarized light component and the phase distribution of the second polarized light component which are designed so that the number of phase difference levels of the phase difference distribution is less than the number of phase levels of the phase distribution of the first polarized light component.

15. A device fabrication method comprising steps of:
exposing a substrate using an exposure apparatus; and
performing a development process for the substrate exposed,
wherein the exposure apparatus comprises:
an illumination optical system configured to illuminate a reticle with a light source, the illumination optical system including a hologram which forms a light intensity distribution on a predetermined plane by using incident light; and
a projection optical system configured to project a pattern of the reticle onto the substrate,
wherein the hologram comprises:
a plurality of cells configured to control both a phase of a first polarized light component in a first polarization direction of the incident light and a phase of a second polarized light component in a second polarization direction perpendicular to the first polarization direction, to form a phase difference distribution between phase distributions for the first and second polarized light components,
wherein the plurality of cells comprises an isotropic medium and an anisotropic medium,
wherein the phase distribution of the first polarized light component and the phase distribution of the second polarized light component are designed so that a number of phase difference levels of the phase difference distribution is less than a number of phase levels of the phase distribution of the first polarized light component, and
wherein the plurality of cells is formed in the hologram based on the phase distribution of the first polarized light component and the phase distribution of the second polarized light component which are designed so that the number of phase difference levels of the phase difference distribution is less than the number of phase levels of the phase distribution of the first polarized light component.

* * * * *